(12) United States Patent
Kobayashi et al.

(10) Patent No.: US 6,984,476 B2
(45) Date of Patent: Jan. 10, 2006

(54) RADIATION-SENSITIVE RESIN COMPOSITION, FORMING PROCESS FOR FORMING PATTERNED INSULATION FILM, ACTIVE MATRIX BOARD AND FLAT-PANEL DISPLAY DEVICE EQUIPPED WITH THE SAME, AND PROCESS FOR PRODUCING FLAT-PANEL DISPLAY DEVICE

(75) Inventors: Kazuki Kobayashi, Izumi (JP); Ikuo Sakono, Soraku-gun (JP); Shinji Shiraki, Tokyo (JP); Hirofumi Sasaki, Tokyo (JP); Kazuaki Niwa, Tokyo (JP)

(73) Assignees: Sharp Kabushiki Kaisha, Osaka (JP); JSR Corporation, Tokyo (JP)

( * ) Notice: Subject to any disclaimer, the term of this patent is extended or adjusted under 35 U.S.C. 154(b) by 143 days.

(21) Appl. No.: 10/410,394

(22) Filed: Apr. 10, 2003

(65) Prior Publication Data

US 2003/0193624 A1  Oct. 16, 2003

(30) Foreign Application Priority Data

Apr. 15, 2002 (JP) .............................. 2002-112442

(51) Int. Cl.
  G03F 7/023 (2006.01)
  G03F 7/30 (2006.01)
(52) U.S. Cl. .......................... 430/7; 430/191; 430/192; 430/193; 430/326
(58) Field of Classification Search ................ 430/191, 430/192, 193, 280.1, 326, 7
See application file for complete search history.

(56) References Cited

U.S. PATENT DOCUMENTS 5,362,597 A * 11/1994 Sano et al. .................. 430/191
6,797,450 B2 * 9/2004 Suzuki et al. ............... 430/166
2002/0136979 A1 * 9/2002 Miyake et al. .............. 430/156
2003/0134222 A1 * 7/2003 Lee et al. .................... 430/191
2004/0101780 A1 * 5/2004 Maemoto ................. 430/273.1
2004/0248030 A1 * 12/2004 Kim et al. ................ 430/270.1

FOREIGN PATENT DOCUMENTS

| JP | 2000-223270 | 8/2000 |
|---|---|---|
| WO | WO 99/10862 | 3/1999 |
| WO | WO 99/48339 | 9/1999 |

* cited by examiner

Primary Examiner—John S. Chu
(74) Attorney, Agent, or Firm—Oblon, Spivak, McClelland, Maier & Neustadt, P.C.

(57) ABSTRACT

The invention provides a radiation-sensitive resin composition, by which a patterned insulation film whose water repellency varies is easily formed with high precision, a process for forming a patterned insulation film using this composition, a display element and an flat-panel disply device using the composition, and a process for producing the flat-panel disply device.

The resin composition comprises (A) an alkali-soluble copolymer, (B) a 1,2-quinonediazide compound and (C) a water-repellent siloxane resin in particular proportions. In the production process of the patterned insulation film, patterning exposure and development are conducted on a coating formed of the resin composition. The display element and flat-panel disply device are equipped with an interlayer insulation film formed by the resin composition. The production process of the flat-panel disply device comprises an interlayer insulation film-forming step including a treatment of patterning exposure exposing conductor layer-forming regions in an exposure that only surface layer portions are cured in one part thereof, and the whole in the thickness-wise direction thereof is cured in the other parts, and a conductor layer-forming step of forming conductor layers on the surface of the interlayer insulation film with a liquid material.

15 Claims, 6 Drawing Sheets

RADIATION-SENSITIVE RESIN COMPOSITION, FORMING PROCESS FOR FORMING PATTERNED INSULATION FILM, ACTIVE MATRIX BOARD AND FLAT-PANEL DISPLAY DEVICE EQUIPPED WITH THE SAME, AND PROCESS FOR PRODUCING FLAT-PANEL DISPLAY DEVICE

BACKGROUND OF THE INVENTION

1. Field of the Invention

The present invention relates to a material for forming a protective film or the like used in, for example, electronic parts, particularly, a radiation-sensitive resin composition suitable for use as a material for forming an interlayer insulation film in a liquid crystal display device or the like, a process for forming a patterned insulation film using this radiation-sensitive resin composition, an active matrix board having an interlayer insulation film composed of this radiation-sensitive resin composition, a flat-panel display device equipped with this active matrix board, and a process for producing the flat-panel display device.

2. Description of the Background Art

At present, a flat-panel or plane type display device, for example, a liquid crystal display device or the like comes to be utilized as a display screen for OA apparatus, for example, personal computers or the like, or household electric apparatus, for example, televisions or the like. As such a liquid crystal display device, an active matrix type liquid crystal display device using a thin film transistor (hereinafter referred to as "TFT") as a switching element is widely used.

The active matrix type liquid crystal display device is equipped with a TFT array board obtained by forming, on the surface of a transparent glass substrate, a TFT active matrix circuit in which plural scanning lines and plural signal lines are formed in the form of a matrix, and switching elements each composed of TFT are arranged in the vicinity of positions at which the scanning line and the signal line intersect. This TFT array board can be produced by repeatedly conducting a patterning step of forming a minute pattern by, for example, a photolithographic process.

More specifically, this process is conducted by repeating, as needed, a series of steps including, for example, a film-forming step of forming an insulation film, a semiconductor layer, a metal layer and/or the like on a substrate, a resist-applying step of applying a photosensitive resist for forming a pattern, an exposing step of conducting exposure wherein a proper mask having a prescribed pattern is superimposed on a photosensitive resist layer formed, a developing step of developing the photosensitive resist in the exposed region to remove it, an etching step of removing a film exposed on the surface by removing the resist in the developing step and a separating step of removing the remaining resist.

In the active matrix type liquid crystal display device, there is known that having a structure that an interlayer insulation film for mutually insulating wirings provided in the form of a layer is formed on the surface of the glass substrate, and a transparent conductor film making up a pixel electrode on the surface of the interlayer insulation film is formed in a state connected to a switching element. According to such a structure, improvement in display quality and high numerical aperture can be achieved. For example, Japanese Patent Application Laid-Open No. 152625/1997 discloses a technique to achieve a high numerical aperture by overlapping a gate electrode and a source wiring with a pixel electrode through an interlayer insulation film.

In order to form the transparent conductor film making up the pixel electrode in the production of such a TFT array board, it is necessary to form a transparent conductor layer on the whole surface of the interlayer insulation film formed on the substrate and subject the transparent conductor layer to patterning treatment, thereby forming a transparent conductor film having a desired shape.

An example of the conventional processes for producing a TFT active matrix board will hereinafter be described.

The TFT array board is produced by using an array board material in which a TFT element 21 making up a switching element is arranged on an insulating substrate 20A as shown in, for example, FIG. 9. In FIG. 9, reference numeral 22 indicates a gate electrode connected to a gate wiring, 23 a gate insulation film for insulating the gate electrode 22 from other components, 24 a semiconductor layer formed on the gate insulation film 23 so as to be placed over the gate electrode 22, 25A and 25B a source electrode and drain electrode, respectively, 26A and 26B an ohmic contact layer composed of $n^+$ Si for connecting the semiconductor layer 24 to the source electrode 25A and an ohmic contact layer composed of $n^+$ Si for connecting the semiconductor layer 24 to the drain electrode 25B, respectively, and 27 a protective layer for protecting the whole TFT element.

As illustrated in FIG. 10, an organic resin material having photosensitivity is applied to an upper surface of the array board material to form a coating, the coating is exposed through a mask having a prescribed pattern for forming a contact hole through which a transparent conductor film making up a pixel electrode, which will be described subsequently, is connected to the drain electrode 25B, and the photosensitive resin in the exposed region is then removed by a developing treatment, thereby forming an interlayer insulation film 30 having the contact hole 32.

After the transparent conductor film 35 formed of, for example, ITO is formed by, for example, sputtering or vapor deposition on the whole surface of the interlayer insulation film 30 including the exposed surface through the contact hole 32 of the drain electrode 25B as illustrated in FIG. 11, a photoresist 51 is applied on to the transparent conductor film 35, the photoresist is exposed through a proper mask, and the photoresist is then subjected to a developing treatment, thereby removing an unnecessary portion of the photoresist (photolithographic treatment) as illustrated in FIG. 12.

After a portion of the transparent conductor film, which is not protected by the photoresist 51, is then removed by using, for example, a chemical liquid or gas (etching treatment) as illustrated in FIG. 13, the remaining photoresist 51 is removed by using, for example, a chemical liquid or gas (separating treatment) as illustrated in FIG. 14, thereby a TFT active matrix board 50 is produced.

In the production process of an active matrix type liquid crystal display device in accordance with such a process as described above, many steps are required for forming the transparent conductor film as a pixel electrode on the interlayer insulation film and hence it involves such problems that, for example, productivity and production yield are low, and great production cost is required.

In order to solve such problems, International Publication No. WO 99/10862 discloses, a technique that thick bank layers (bank) are formed along data lines (sig) and scanning lines (gate), thereby reducing a capacity parasitic on the data lines (sig) and partitioning a region for forming an organic semiconductor film (43) of a thin film light-emitting device

(40) to form the organic semiconductor film (43) by an ink-jet method as a process for producing an active matrix type display device, by which, upon production of a display device formed of an organic EL element or color filter, a thick insulation film can be suitably formed about an organic semiconductor film of a thin film light-emitting element without impairing the thin film light-emitting element. Herein, the bank layer (bank) is constructed by a thick lower layer-side insulation film composed of an inorganic material and an upper interlayer insulation film composed of an organic material laminated on the lower layer-side insulation film with a narrow width so that the organic semiconductor film is avoided to come into mutual contact with the upper interlayer insulation film.

For example, International Publication No. WO 99/48339 and Japanese Patent Application Laid-Open No. 2000-353594 disclose, a process for forming an organic semiconductor layer in a region to be coated partitioned by a bank by an ink-jet method, as a process for producing a display device using an EL element or a color filter, in which a variation of film thickness between each of pixels is little, and describe that upon the formation of the organic semiconductor layer, the bank is formed with an organic substance on a bank-forming surface of an inorganic substance, for example, in advance and the surface of the bank is modified by a method of performing a plasma treatment under conditions of excessive fluorine, a method of performing an oxygen gas plasma treatment followed by a fluorine-containing gas plasma treatment, or the like.

For example, Japanese Patent Application Laid-Open No. 2000-223270 discloses a technique that in an electroluminescence element having a light-emitting layer held by 2 patterned electrodes in correspondence to the pattern thereof, at least one patterned layer, the surface wettability of which with a laminate material is increased by irradiation of light, is arranged, and the light-emitting layer is laminated making good use of a difference in wettability between an irradiated site and a non-irradiated site.

However, in the processes of producing an EL element or color filter material by the ink-jet method as disclosed in International Publication Nos. WO 99/10862 and WO 99/48339 and Japanese Patent Application Laid-Open No. 2000-353594, it is necessary to form a bank layer constructed by, for example, a thick lower layer-side insulation film composed of an inorganic material, an upper interlayer insulation film composed of an organic material, laminated on the lower layer-side insulation film with a narrow width in a region to form the organic semiconductor layer, and moreover it is necessary to modify the surface of the bank.

When the interlayer insulation film is formed by a particular patterned layer as disclosed in Japanese Patent Application Laid-Open No. 2000-223270, a photolithographic step, etching step and removing step are required for forming a contact hole for connecting upper and lower electrode materials to each other.

Accordingly, any of the above processes involve a problem that they incur not only increase in material cost, but also increase in apparatus cost by the increased number of steps, increase in area of clean room, or lowering of productivity and production yield, and after all, it is difficult to advantageously produce a flat-panel display device.

SUMMARY OF THE INVENTION

The present invention has been made on the basis of the foregoing circumstances.

It is an object of the present invention to provide a radiation-sensitive resin composition suitable for use as a material for forming a patterned insulation film in flat-panel display devices or the like, specifically, a radiation-sensitive resin composition capable of easily forming a patterned insulation film having a patterned surface varying in the degree of water repellency or wettability according to an exposure pattern with high precision.

Another object of the present invention is to provide a process for forming a patterned insulation film, by which an insulation film having a patterned surface varying in the degree of water repellency or wettability according to an exposure pattern can be easily formed with high precision by performing patterning exposure and development.

A further object of the present invention is to provide a process capable of simplifying a production process by using the above-described radiation-sensitive resin composition, and thus, of advantageously producing a flat-panel display device.

A still further object of the present invention is to provide a display element having a patterned insulation film formed by the above-described radiation-sensitive resin composition, and a flat-panel display device equipped with this display element.

According to the present invention, there is thus provided a radiation-sensitive resin composition comprising:
(A) 100 parts by weight of an alkali-soluble copolymer obtained by the following components (a), (b) and (c):
   (a) an unsaturated carboxylic acid,
   (b) a radical-polymerizable compound containing an epoxy group, and
   (c) any other radical-polymerizable compound than the components (a) and (b),
(B) 5 to 100 parts by weight of a 1,2-quinonediazide compound, and
(C) at least 0.1 parts by weight of a water-repellent siloxane resin.

According to the present invention, there is also provided a process for forming a patterned insulation film, which comprises the steps of applying a liquid material for formation of an insulation film comprising the radiation-sensitive resin composition described above to form a coating for formation of an insulation film, exposing through a patterning mask and developing the coating for formation of an insulation film to remove a surface layer portion of an exposed region in the coating, and then subjecting the coating to a heating treatment, thereby forming a low water-repellent region where the content of the water-repellent siloxane resin at the surface is low in the exposed region and forming a high water-repellent region where the content of the water-repellent siloxane resin at the surface is high in an unexposed region.

According to the present invention, there is further provided an active matrix board comprising a substrate, on the surface of which an active matrix circuit is formed by arranging plural scanning lines and plural data lines in the form of a matrix and providing switching elements in the vicinity of respective positions at which the scanning line and the data line intersect, an interlayer insulation film formed on the substrate so as to cover the scanning lines, the data lines and the switching elements, and conductor layers formed on the interlayer insulation film in a state connected to the respective switching elements, wherein the interlayer insulation film is formed by the radiation-sensitive resin composition described above.

According to the present invention, there is still further provided a flat-panel display device comprising the active matrix board described above, an opposite board arranged in opposed relation to the active matrix board and having electrode parts opposite to the respective conductor layers in the active matrix board, and an optically controlled member held between the active matrix board and the opposite board.

According to the present invention, there is yet still further provided a flat-panel display device comprising a light-emitting element board in which an organic semiconductor layer and an opposite electrode are arranged on the upper surface of each conductor layer in the active matrix board described above.

According to the present invention, there is yet still further provided a process for producing a flat-panel display device equipped with a display element having a substrate, on the surface of which an active matrix circuit is formed by arranging plural scanning lines and plural data lines in the form of a matrix and providing switching elements in the vicinity of respective positions at which the scanning line and the data line intersect, an interlayer insulation film formed on the substrate so as to cover the scanning lines, the data lines and the switching elements, and conductor layers formed on the interlayer insulation film in a state connected to the respective switching elements, which comprises the steps of:

forming an interlayer insulation film by applying a liquid material for formation of an insulation film comprising the radiation-sensitive resin composition described above on to the substrate to form a coating for formation of an insulation film, subjecting the coating for formation of an insulation film to a patterning exposure treatment in accordance with a pattern varying in an exposure, and subjecting the coating for formation of an insulation film to a developing treatment to remove the coating in exposed regions, thereby forming difference in level for partitioning its corresponding conductor layer-forming region and forming contact holes, and forming conductor layers by applying a conductor layer-forming material composed of a liquid material to the surface of the interlayer insulation film formed on the substrate.

In step of forming the interlayer insulation film, in the process for producing the flat-panel display device according to the present invention, the interlayer insulation film may be formed by performing the patterning exposure treatment by controlling an exposure in such a manner that only surface layer portions are cured in a part of conductor layer-forming regions, in which the conductor layers should be formed in the coating for formation of an insulation film, and the whole in the thickness-wise direction thereof is cured in the other parts of the conductor layer-forming regions in a state that other surface regions than the conductor layer-forming regions have been screened from light, and then subjecting the coating for formation of an insulation film to a developing treatment, thereby removing surface layer portions in the coating for formation of an insulation film in a part of the conductor layer-forming regions, and removing the whole of the coating for formation of an insulation film in the other parts of the conductor layer-forming regions to form difference in level for partitioning the conductor layer-forming region and to form the contact holes.

In the step of forming the interlayer insulation film in the process for producing the flat-panel display device according to the present invention, a difference in contact angle between a contact angle of each conductor layer-forming region with purified water and a contact angle of any other surface region than the conductor layer-forming region with purified water after the patterning exposure treatment may preferably be at least 20°.

In the step of forming the interlayer insulation film, the height of the difference in level formed by the developing treatment may preferably be at least 0.2 $\mu$m.

In the active matrix board or the flat-panel display device described above, the conductor layers may preferably be formed by a liquid material.

According to the radiation-sensitive resin composition of the present invention, there can be formed a patterned insulation film having surface regions different in water repellency or wettability from each other by using a sole material and conducting patterning exposure and developing treatment without performing a particular surface-modifying treatment, and thus can be formed a patterned insulation film in a state that a liquid material, for example, a liquid conductive material, liquid material for color filter or liquid material for organic EL, remains in only the surface regions high in wettability, in which a desired functional film is to be formed, and does not remain in other regions than said surface regions by conducting only a process that such a liquid material is applied on to the whole upper surface of the insulation film by an ordinary method and dried, whereby various kinds of liquid materials can be self-conformably patterned.

Accordingly, there is no need to perform a step of forming bank layers having water repellency and a surface-modifying treatment, which have heretofore been required, in the case where conductor layers or the like are formed with a liquid material, so that a desired insulation film can be formed with ease by fewer treatment steps and high precision to advantageously produce a flat-panel display device such as a liquid crystal display device.

DETAILED DESCRIPTION OF THE PREFERRED EMBODIMENTS

Figure 1:
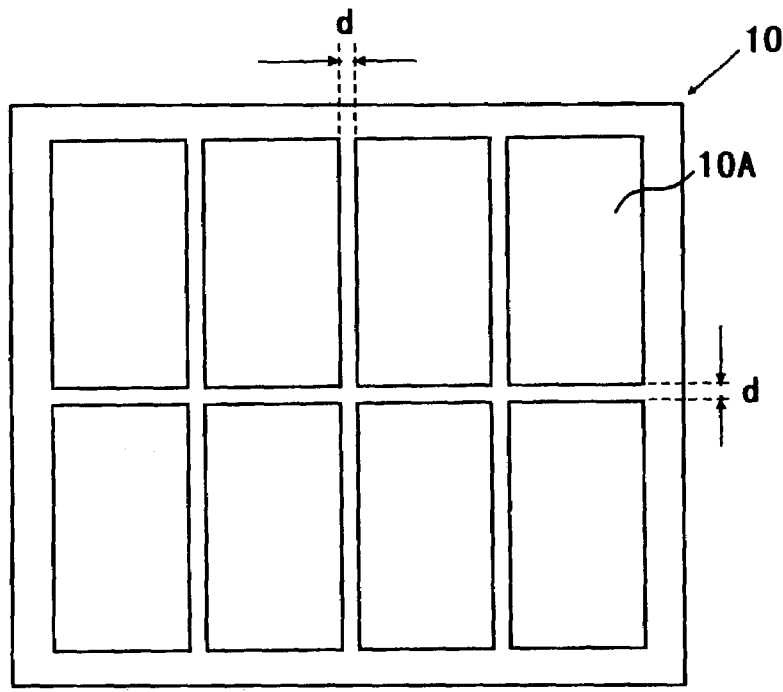
FIG. 1 is a plan view illustrating the construction of a mask used upon an exposure treatment in an experimental Example performed for demonstrating the effects of the radiation-sensitive resin composition according to the present invention.

The present invention will hereinafter be described specifically.

[Radiation-sensitive Resin Composition]

The radiation-sensitive resin composition according to the present invention comprises (A) 100 parts by weight of an alkali-soluble copolymer obtained by the following components (a), (b) and (c); (B) 5 to 100 parts by weight of a 1,2-quinonediazide compound and (C) at least 0.1 parts by weight of a water-repellent siloxane resin:

(a) an unsaturated carboxylic acid,
(b) a radical-polymerizable compound containing an epoxy group, and
(c) any other radical-polymerizable compound than the components (a) and (b).

<Component (A)>

The component (A) used in the radiation-sensitive resin composition according to the present invention is an alkali-soluble copolymer soluble in an aqueous alkali solution and capable of being crosslinked by heating.

The component (A) is obtained by subjecting (a) an unsaturated carboxylic acid, (b) a radical-polymerizable compound containing an epoxy group and (c) any other radical-polymerizable compound than (a) the unsaturated carboxylic acid and (b) the radical-polymerizable compound containing an epoxy group to a radical polymerization reaction in a solvent.

The components (a), (b) and (c) will hereinafter be referred to as "monomer (a)", "monomer (b)" and "monomer (c)", respectively.

As specific examples of the unsaturated carboxylic acid of the monomer (a), may be mentioned unsaturated carboxylic acids having an ethylenically unsaturated double bond, for example, methacrylic acid, acrylic acid, maleic acid, itaconic acid, citraconic acid, mesaconic acid, fumaric acid, crotonic acid, 1,4-cyclohexenedicarboxylic acid, o-vinylbenzoic acid, m-vinylbenzoic acid and p-vinyl-benzoic acid. Among these, methacrylic acid and acrylic acid may be preferred. These unsaturated carboxylic acids may be used either singly or in any combination thereof.

The proportion of the monomer (a) in the alkali-soluble copolymer (A) is 5 to 50% by mass, preferably 10 to 40% by mass. If this proportion is lower than 5% by mass, such a copolymer (A) becomes hardly soluble in an aqueous alkali solution, and so the sensitivity and developability of the resulting composition may be deteriorated in some cases. If the proportion exceeds 50% by mass on the other hand, the solubility of such a resin obtained in an aqueous alkali solution becomes too high, and so decrease of the rate of residual film (film-thickness reducing phenomenon) in an unexposed region is easily caused upon conducting a developing treatment.

As specific examples of the radical-polymerizable compound containing an epoxy group as the monomer (b), may be mentioned glycidyl acrylate, glycidyl methacrylate, α-ethylglycidyl acrylate, α-n-propylglycidyl acrylate, α-n-butylglycidyl acrylate, 3,4-epoxybutyl acrylate, 3,4-epoxybutyl methacrylate, 3,4-epoxyheptyl acrylate, 3,4-epoxyheptyl methacrylate, α-ethyl-6,7-epoxyheptyl acrylate, allyl glycidyl ether and vinyl glycidyl ether. Among these, glycidyl acrylate, glycidyl methacrylate and vinyl glycidyl ether are preferred. These radical-polymerizable compounds containing an epoxy group may be used either singly or in any combination thereof.

The proportion of the monomer (b) in the alkali-soluble copolymer (A) is preferably 5 to 70% by mass, more preferably 10 to 50% by mass. If this proportion is lower than 5% by mass, the heat resistance and solvent resistance of a patterned insulation film formed by the resulting radiation-sensitive resin composition are liable to be insufficient. If the proportion exceeds 70% by mass on the other hand, the shelf stability of such an alkali-soluble copolymer is liable to be insufficient.

Any other radical-polymerizable compound (hereinafter referred to as "further radical-polymerizable compound") than the monomer (a) and the monomer (b) as the monomer (c) is such that the monomer (c) inhibits the carboxyl group of the monomer (a) and the epoxy group of the monomer (b) from reacting, by copolymerization of the monomer (c) with the monomer (a) and the monomer (b), thereby preventing the polymerization reaction system from being gelled.

As specific examples of the further radical-polymerizable compound having such gelling-preventing action, may be mentioned styrenes such as styrene, α-methylstyrene, o-methylstyrene, m-methylstyrene, p-methylstyrene, p-methoxystyrene, p-tert-butoxystyrene and chloromethylstyrene; diolefins such as butadiene, 2,3-dimethylbutadiene and isoprene; methyl, ethyl, n-propyl, isopropyl, n-butyl, sec-butyl, tert-butyl, 2-ethylhexyl, lauryl, dodecyl, tricyclo[5,2,1,0$^{2,6}$] decan-8-yl, isobornyl, cyclohexyl, 2-methylcyclohexyl, dicyclohexyl, adamantyl, allyl, propargyl, phenyl, naphthyl, anthracenyl, cyclopentyl, furyl, tetrahydrofuryl, pyranyl, benzyl, phenethyl, cresyl, 1,1,1-trifluoroethyl, perfluoroethyl, perfluoro-n-propyl, perfluoro-isopropyl, triphenylmethyl and cumyl esters of methacrylic acid or acrylic acid; and N,N-dimethylamide, N,N-propylamide and anilide of methacrylic acid or acrylic acid; acrylonitrile, acrolein, methacrylonitrile, vinyl chloride, vinylidene chloride, n-vinylpyrrolidone and vinyl acetate. Among these, styrene, butadiene, p-tert-butoxystyrene, and tert-butyl ester, tricyclo [5,2,1,0$^{2,6}$]decan-8-yl ester, pyranyl ester and benzyl ester of methacrylic acid or acrylic acid are preferred. These radical-polymerizable compounds may be used either singly or in any combination thereof.

The proportion of the monomer (c) in the alkali-soluble copolymer (A) is preferably 10 to 70% by mass, more preferably 20 to 60% by mass. If this proportion is lower than 10% by mass, the polymerization system tends to cause gelling. If the proportion exceeds 70% by mass on the other hand, the solubility of a copolymer in an aqueous alkali solution may be lowered, or the heat resistance of an insulation film formed by the resulting radiation-sensitive resin composition may become insufficient in some cases.

As examples of those particularly preferably used among the alkali-soluble copolymers (A) described above, may be mentioned styrene/methacrylic acid/glycidyl methacrylate copolymers, styrene/methacrylic acid/glycidyl methacrylate/tricyclo[5,2,1,0$^{2,6}$]decan-8-yl methacrylate copolymers, 1,3-butadiene/methacrylic acid/glycidyl methacrylate/tricyclo[5,2,1,0$^{2,6}$]decan-8-yl methacrylate copolymers, 1,3-butadiene/styrene/methacrylic acid/glycidyl methacrylate copolymers, 1,3-butadiene/styrene/methacrylic acid/glycidyl methacrylate/tricyclo[5,2,1,0$^{2,6}$]decan-8-yl methacrylate copolymers and 1,3-butadiene/styrene/methacrylic acid/glycidyl methacrylate/tricyclo-[5,2,1,0$^{2,6}$]decan-8-yl methacrylate/cyclohexylmaleimide copolymers.

As examples of the polymerization solvent used in the polymerization reaction, may be mentioned alcohols such as methanol, ethanol and diacetone alcohol; ethers such as tetrahydrofuran, tetrahydropyran and dioxane; glycol ethers such as ethylene glycol monomethyl ether and ethylene glycol monoethyl ether; ethylene glycol alkyl ether acetates such as methyl cellosolve acetate and ethyl cellosolve acetate; diethylene glycol alkyl ethers such as diethylene glycol monomethyl ether, diethylene glycol monoethyl ether, diethylene glycol dimethyl ether, diethylene glycol diethyl ether and diethylene glycol ethyl methyl ether; propylene glycol monoalkyl ethers such as propylene glycol methyl ether, propylene glycol ethyl ether, propylene glycol propyl ether and propylene glycol butyl ether; propylene glycol alkyl ether acetates such as propylene glycol methyl ether acetate, propylene glycol ethyl ether acetate, propylene glycol propyl ether acetate and propylene glycol butyl ether acetate; propylene glycol alkyl ether propionates such as propylene glycol methyl ether propionate, propylene glycol ethyl ether propionate, propylene glycol propyl ether propionate and propylene glycol butyl ether propionate; aromatic hydrocarbons such as toluene and xylene; ketones such as methyl ethyl ketone, cyclohexanone and 4-hydroxy-4-methyl-2-pentanone; and esters such as methyl acetate, ethyl acetate, propyl acetate, butyl acetate, ethyl 2-hydroxypropionate, methyl 2-hydroxy-2-methylpropionate, ethyl 2-hydroxy-2-methyl-propionate, methyl hydroxyacetate, ethyl hydroxyacetate, butyl hydroxyacetate, methyl lactate, ethyl lactate, propyl lactate, butyl lactate, methyl 3-hydroxypropionate, ethyl 3-hydroxypropionate, propyl 3-hydroxypropionate, butyl 3-hydroxypropionate, methyl 2-hydroxy-3-methylbutanoate, methyl methoxyacetate, ethyl methoxyacetate, propyl methoxyacetate, butyl methoxyacetate, methyl ethoxyacetate, ethyl ethoxyacetate, propyl ethoxyacetate, butyl ethoxyacetate, methyl propoxyacetate, ethyl propoxyacetate, propyl propoxyacetate, butyl propoxyacetate, methyl butoxyacetate, ethyl butoxyacetate, propyl butoxyacetate, butyl butoxyacetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate and butyl 3-butoxypropionate.

The amount of the solvent for polymerization reaction used is preferably 20 to 1,000 parts by weight per 100 parts by weight of the reaction materials.

As a polymerization initiator used in the polymerization reaction, may be used that generally known as a radical polymerization initiator, and examples thereof include azo compounds such as 2,2'-azobisisobutyronitrile, 2,2'-azobis(2,4-dimethylvaleronitrile) and 2,2'-azobis(4-methoxy-2,4-dimethylvaleronitrile); organic peroxides such as benzoyl peroxide, lauroyl peroxide, t-butyl peroxypivalate and 1,1'-bis(t-butylperoxy)cyclohexane; and hydrogen peroxide. When a peroxide is used as the radical polymerization initiator, the peroxide may be used together with a reducing agent to provide a redox type initiator.

The weight average molecular weight in terms of polystyrene of the alkali-soluble copolymer (A) used in the radiation-sensitive resin composition according to the present invention is preferably 2,000 to 100,000, more preferably 3,000 to 50,000, particularly preferably 5,000 to 30,000. If the average molecular weight is lower than 2,000, the resulting composition tends to have difficulty in forming a pattern, lower the rate of residual film in an unexposed region upon a developing treatment, have difficulty in developing and/or form an insulation film insufficient in heat resistance. If the average molecular weight exceeds 100,000 on the other hand, the resulting composition tends to have difficulty in forming a pattern and/or in developing, and in particular, the sensitivity of a coating for formation of an insulation film obtained from the resulting radiation-sensitive resin composition is liable to be insufficient, and so developability is markedly deteriorated.

<Component (B)>

The 1,2-quinonediazide compound used in the radiation-sensitive resin composition according to the present invention preferably has a property that a carboxylic acid is formed by irradiation. As examples thereof, may be mentioned 1,2-benzoquinonediazidosulfonic acid esters, 1,2-naphthoquinonediazidosulfonic acid esters, 1,2-benzoquinonediazidosulfonic acid amides and 1,2-naphthoquinonediazidosulfonic acid amides or the like.

Specific examples thereof include:
trihydroxybenzophenone-1,2-naphthoquinonediazidosulfonates such as 2,3,4-trihydroxybenzophenone-1,2-naphthoquinonediazido-4-sulfonates, 2,3,4-trihydroxybenzophenone-1,2-naphthoquinonediazido-5-sulfonates, 2,4,6-trihydroxybenzophenone-1,2-naphtoquinonediazido-4-sulfonates and 2,4,6-trihydroxybenzophenone-1,2-naphthoquinonediazido-5-sulfonates;
tetrahydroxybenzophenone-1,2-naphthoquinonediazidosulfonates such as 2,2',4,4'-tetrahydroxybenzophenone-1,2-naphthoquinonediazido-4-sulfonates, 2,2',4,4'-tetrahydroxybenzophenone-1,2-naphthoquinonediazido-5-sulfonates, 2,3,4,3'-tetrahydroxybenzophenone-1,2-naphthoquinonediazido-4-sulfonates, 2,3,4,3'-tetrahydroxybenzophenone-1,2-naphthoquinonediazido-5-sulfonates, 2,3,4,4'-tetrahydroxybenzophenone-1,2-naphthoquinonediazido-4-sulfonates, 2,3,4,4'-tetrahydroxybenzophenone-1,2-naphthoquinonediazido-5-sulfonates, 2,3,4,2'-tetrahydroxy-4'-methylbenzophenone-1,2- naphthoquinonediazido-4-sulfonates, 2,3,4,2'-tetrahydroxy-4'-methylbenzophenone-1,2-naphthoquinone-diazido-5-sulfonates, 2,3,4,4'-tetrahydroxy3'-methoxybenzophenone-1,2-naphthoquinonediazido-4-sulfonates, and 2,3,4,4'-tetrahydroxy-3'-methoxybenzophenone-1,2-naphthoquinonediazido-5-sulfonates;
pentahydroxybenzophenone-1,2-naphthoquinonediazido-sulfonates such as 2,3,4,2',6'-pentahydroxybenzophenone-1,2-naphthoquinonediazido-4-sulfonates and 2,3,4,2',6'-pentahydroxybenzophenone-1,2-naphthoquinonediazido-5-sulfonates;
hexahydroxybenzophenone-1,2-naphthoquinonediazido-sulfonates such as 2,4,6,3',4',5'-hexahydroxybenzophenone-1,2-naphthoquinonediazido-4-sulfonates, 2,4,6,3',4',5'-hexahydroxybenzophenone-1,2-naphthoquinonediazido-5-sulfonates, 3,4,5,3',4',5'-hexahydroxybenzophenone-1,2-naphthoquinonediazido-4-sulfonates and 3,4,5,3',4',5'-hexahydroxybenzophenone-1,2-naphthoquinonediazido-5-sulfonates; and
(polyhydroxyphenyl)alkane-1,2-naphthoquinonediazido-sulfonates such as bis(2,4-dihydroxyphenyl)methane-1,2-naphthoquinonediazido-4-sulfonates, bis(2,4-dihydroxyphenyl)methane-1,2-naphthoquinonediazido-5-sulfonates, bis(p-hydroxyphenyl)methane-1,2-naphthoquinonediazido-4-sulfonates, bis(p-hydroxyphenyl)-methane-1,2-naphthoquinonediazido-5-sulfonates, tri(p-hydroxyphenyl)methane-1,2-naphthoquinonediazido-4-sulfonates, tri(p-hydroxyphenyl)methane-1,2-naphthoquinonediazido-5-sulfonates, 1,1,1-tri(p-hydroxyphenyl)ethane-1,2-naphthoquinonediazido-4-sulfonates, 1,1,1-tri(p-hydroxyphenyl)ethane-1,2-naphthoquinonediazido-5-sulfonates, bis (2,3,4-trihydroxyphenyl)methane-1,2-naphthoquinonediazido-4-sulfonates, bis(2,3,4-trihydroxyphenyl)methane-1,2-naphthoquinonediazido-5-sulfonates, 2,2-bis(2,3,4-trihydroxyphenyl)propane-1,2-naphthoquinonediazido-4-sulfonates, 2,2-bis(2,3,4-trihydroxyphenyl)propane-1,2-naphthoquinonediazido-5-sulfonates, 1,1,3-tris( 2,5-dimethyl-4-hydroxyphenyl)-3-phenylpropane-1,2-naphthoquinonediazido-4-sulfonates,1,1,3-tris( 2,5-dimethyl-4-hydroxyphenyl)-3-phenylpropane-1,2-naphthoquinonediazido-5-sulfonates, 4,4'-[1-[ 4-[1-[4-hydroxyphenyl]-1-methylethyl]phenyl]ethylidene] bisphenol-1,2,-naphtoquinonediazido-4-sulfonates, 4,4'-[1-[4-[1-[4-hydroxyphenyl]-1-methylethyl]phenyl]ethylidene] bisphenol-1,2-naphthoquinonediazido-5-sulfonates, bis(2,5-dimethyl-4-hydroxyphenyl)-2-hydroxyphenylmethane-1,2-naphthoquinone-diazido-4-sulfonates, bis(2,5-dimethyl-4-hydroxyphenyl)-2-hydroxyphenylmethane- 1,2-naphthoquinonediazido-5-sulfonates, 3,3,3',3'-tetramethyl-1,1'-spiro-bi-indene-5,6,7,5',6', 7'-hexanol-1,2-naphthoquinonediazido-4-sulfonates, 3,3,3',3'-tetramethyl-1,1'-spiro-bi-indene-5, 6,7,5',6',7'-hexanol-1,2-naphthoquinonediazido-5-sulfonates, 2,2,4-trimethyl-7,2',4'-trihydoxyflavan-1,2-naphthoquinonediazido-4-sulfonates and 2,2,4-trimethyl-7,2', 4'-trihydoxyflavan-1,2-naphthoquinonediazido-5-sulfonates.

Besides these compounds, may be used those described in "Light-Sensitive Systems" written by J. Kosar, 339–352 (1965), John Wiley & Sons Co. (New York) and "Photoresist" written by W. S. De Fores, 50 (1975), McGraw-Hill, Inc. (New York).

The 1,2-quinonediazide compound as described above may be used in the form of a condensate obtained by reacting a part amount or the whole amount of it with the alkali-soluble copolymer of the component (A).

Among these 1,2-quinonediazide compounds, 1,1,3-tris (2,5-dimethyl-4-hydroxyphenyl)-3-phenylpropane-1,2-naphthoquinonediazido-5-sulfonates, 1,1,3-tris(2,5-dimethyl-4-hydroxyphenyl)-3-phenylpropane-1,2-naphthoquinonediazido-4-sulfonates, 4,4'-[1-[4-[1-[4-hydroxyphenyl]-1-methylethyl]phenyl]ethylidene] bisphenol-1,2-naphthoquinonediazido-4-sulfonates, 4,4'-[1-[4-[ 1-[4-hydroxyphenyl]-1-methylethyl]phenyl]ethylidene] bisphenol-1,2-naphthoquinonediazido-5-sulfonates, 2,2,4-trimethyl-7,2'4'-trihydoxyflavan-1,2-naphthoquinone-diazido-5-sulfonates, 2,2,4-trimethyl-7,2',4'-trihydoxyflavan-1,2-naphthoquinonediazido-4-sulfonates, 1,1,1-tri(p-hydroxyphenyl) ethane-1,2-naphthoquinonediazido-4-sulfonates and 1,1,1-tri(p-hydroxyphenyl)ethane-1, 2-naphthoquinone-diazido-5-sulfonates are preferably used in the present invention from the viewpoint of an inhibitory effect on dissolution of the alkali-soluble copolymer, in particular.

These 1,2-quinonediazide compounds may be used either singly or in any combination thereof.

The proportion of the 1,2-quinonediazide compound of the component (B) used is preferably 5 to 100 parts by weight, more preferably 10 to 50 parts by weight per 100 parts by weight of the alkali-soluble copolymer of the component (A). If this proportion is lower than 5 parts by weight, the resulting resin composition tends to have difficulty in patterning because the amount of a carboxylic acid formed by irradiation is small. If this proportion exceeds 100 parts by weight on the other hand, the resulting resin composition cannot achieve sufficient sensitivity because it is difficult to decompose all the component (B) added by short-time irradiation, and so an unreacted component (B) remains in plenty, resulting in difficulty in developing.

In the radiation-sensitive resin composition according to the present invention, a sensitizer for the 1,2-quinonediazide compound (B) may be contained for the purpose of mainly improving sensitivity. Examples of the sensitizer include 2H-pyrido-(3,2-b)-1,4-oxazin-3(4H)-ones, 10H-pyrido-(3, 2-b)-(1,4)-benzothiazines, urazol and derivatives thereof, hydantoin and derivatives thereof, barbituric acid and derivatives thereof, glycine anhydrides, 1-hydroxybenzotriazole and derivatives thereof, alloxans and derivatives thereof, and maleimide and derivatives thereof.

The proportion of these sensitizers used is preferably at most 100 parts by weight, more preferably 4 to 60 parts by weight per 100 parts by weight of the 1,2-quinonediazide compound of the component (B).

<Component (C)>

The water-repellent siloxane resin used in the radiation-sensitive resin composition according to the present invention preferably has a property that it exudes to the surface of a portion related to an unexposed region of an insulation film in a heating treatment for a crosslinking reaction of the component (A) conducted as post-bake, thereby being able to surely achieve a state that the surface formed by removing a surface layer portion of an exposed region by development becomes a low water-repellent region low in existing amount of the water-repellent siloxane resin, and the surface related to the unexposed region becomes a high water-repellent region high in existing amount the water-repellent siloxane resin, in a patterned insulation film to be formed.

As examples of such a water-repellent siloxane resin, may be mentioned linear siloxane resins, branched siloxane resins, cyclic siloxane resins, modified siloxane resins and polysiloxane copolymers.

Specific examples thereof include linear siloxane resins such as dimethylsiloxane resins, methylphenylsiloxane resins, methyl hydrogensiloxane resins, methylethylsiloxane resins, methylpropylsiloxane resins and methylbutylsiloxane resins; cyclic siloxane resins such as cyclic dimethylsiloxane resins, cyclic methylphenylsiloxane resins, cyclic methyl hydrogensiloxane resins, cyclic methylethylsiloxane resins, cyclic methylpropylsiloxane resins and cyclic methylbutylsiloxane resins; modified siloxane resins such as alkoxy-modified siloxane resins, alcohol-modified siloxane resins, carboxyl-modified siloxane resins, epoxy-modified siloxane resins, amino-modified siloxane resins, alkyl aralkyl polyether-modified siloxane resins, polyether-modified siloxane resins and epoxy-polyether-modified siloxane resins, fluorine-modified siloxane resins, and copolymers of a polysiloxane and a polyalkylene oxide.

As examples of commercially available products of the siloxane resins, may be mentioned linear siloxane resins such as L-45 (product of Nippon Unicar Co., Ltd.), SH200, 510, 550, 710, 705 and 1107 (products of Dow Corning Toray Silicone Co., Ltd.), and KF96, 50, 54 and 99, KR271 and 282 (products of Shin-Etsu Chemical Co., Ltd.); cyclic siloxane resins such as VS-7158 (product of Nippon Unicar Co., Ltd.) and BY11-003 (product of Dow Corning Toray Silicone Co., Ltd.); modified siloxane resins such as L-77, 720, 7001 and 7604, Y-7006, L-9300, FZ-2101, 2110, 2130, 2161, 3704, 3711, 3722, 3703, 3720, 3736, 3705 and 3760 (products of Nippon Unicar Co., Ltd.), SF-8427, 8428, 8413 and 8417, SH193, 194, 190, 192, 556, 3746, 3749, 3771 and 8400, SRX280A, BY16-036, -848, -828, -853B, -855B, -839, -845, -752, -750, -838 and -150B, BX16-854 and -866, SF8421EG, SH28PA, SH30PA, ST89PA, and ST103PA (products of Dow Corning Toray Silicone Co., Ltd.), and ES1001N, 1023, X-22-161, -163, -169, -162 and -164, KF-860, -101, -102, -6001, -6011, -6015, -8001, -351, -412, -910 and -905 (products of Shin-Etsu Chemical Co., Ltd.); fluorine-modified siloxane resins such as FS1265 (product of Dow Corning Toray Silicone Co., Ltd.), and X-22-820 and FL100 (products of Shin-Etsu Chemical Co., Ltd.); and copolymers of a polysiloxane and a polyalkylene oxide, such as FZ-2203, 2207 and 2222 (products of Nippon Unicar Co., Ltd.).

Among the siloxane resins mentioned above, polyether-modified siloxane resins, alcohol-modified siloxane resins and copolymers of a polysiloxane and a polyalkylene oxide may preferably be used from the viewpoints of compatibility with the alkali-soluble copolymer of the component (A), solubility in a developing solution and water repellency of an upper surface of a remaining pattern which remains at an unexposed region (light-screening portion). As examples of particularly preferred resins, may be mentioned SH3746, 3771, SH28PA, SH30PA, ST89PA and ST103PA (products of Dow Corning Toray Silicone Co., Ltd.), FZ-2110, -2203, -2207 and -2222 (products of Nippon Unicar Co., Ltd.), and KF-351, -6011 and -6015 (products of Shin-Etsu Chemical Co., Ltd.).

The proportion of the siloxane resin of the component (C) used is at least 0.1 parts by weight, preferably 0.1 to 5 parts by weight, more preferably 0.15 to 3 parts by weight, particularly preferably 0.2 to 2 parts by weight per 100 parts by weight of the alkali-soluble copolymer of the component (A). If this proportion is too low, the water repellency at the surface of a remaining pattern which remains at an unexposed region (light-screening region) is liable to be insufficient. If this proportion is too high, on the other hand, the compatibility with the alkali-soluble copolymer of the component (A) becomes insufficient though it varies according to the kind of the siloxane resin used, so that in some cases, the resulting resin composition may tend to cause phase separation and not achieve sufficient coat-forming ability, and a coating formed by such a resin composition may involve irregularities.

In the radiation-sensitive resin composition according to the present invention, a compound having at least 2 epoxy groups in its molecule may be contained for the purpose of mainly improving heat resistance and adhesion. As specific examples of the compound having at least 2 epoxy groups in its molecule, may be mentioned commercially available bisphenol A type epoxy resin products such as Epikote 1001, 1002, 1003, 1004, 1007, 1009, 1010 and 828 (products of Japan Epoxy Resins co. Ltd.), commercially available bisphenol F type epoxy resin products such as Epikote 807 (product of Japan Epoxy Resins co. Ltd.), commercially available phenolic novolak type epoxy resin products such as Epikote 152 and 154 (products of Japan Epoxy Resins co. Ltd.), and EPPN201 and 202 (products of Nippon Kayaku Co., Ltd.), commercially available cresol novolak type epoxy resin products such as EOCN-102, 103S, 104S, 1020, 1025 and 1027(products of Nippon Kayaku Co., Ltd.), and Epikote 180S75 (product of Japan Epoxy Resins co. Ltd.), commercially available alicyclic epoxy resin products such as CY-175, 177 and 179 (products of CIBA-GEIGY A.G.), ERL-4234, 4299, 4221 and 4206 (products of Union Carbide Corp.), Sho-dine 509 (product of Showa Denko K.K.), Araldite CY-182, -192 and -184 (products of CIBA-GEIGY A.G.), Epiclon 200 and 400 (products of Dainippon Ink & Chemicals, Incorporated) Epikote 871 and 872 (products of Japan Epoxy Resins co. Ltd.), and ED-5661 and 5662 (products of Celanese Coating K.K.), and commercially available aliphatic polyglycidyl ether products such as Epolight 100MF (product of Kyoeisha Chemical Co., Ltd.), and Epiol TMP (product of Nippon Oil & Fats Co., Ltd.). As preferable examples thereof, may be mentioned bisphenol A type epoxy resins, bisphenol F type epoxy resins, phenolic novolak type epoxy resins, cresol novolak type epoxy resins and aliphatic polyglycidyl ethers.

Many of the epoxy compounds mentioned above are high-molecular weight substances. However, the molecular weight of the epoxy compound used in the present invention is not limited. For example, a low-molecular weight substance such as glycidyl ether of bisphenol A or bisphenol F may also be used.

The proportion of the compound having at least 2 epoxy groups in the molecule used is preferably 1 to 100 parts by weight, more preferably 5 to 50 parts by weight per 100 parts by weight of the alkali-soluble copolymer of the component (A).

A cured product formed from a composition containing the compound having at least 2 epoxy groups in the molecule in such a range becomes excellent in heat resistance and adhesion. If this proportion is lower than 1 part by weight, the reaction with a carboxylic acid formed from the 1,2-quinonediazide compound of the component (B) by irradiation becomes hard to sufficiently proceed, and so a cured film formed from the resulting composition may become hard to achieve the expected heat resistance and solvent resistance in some cases. If the proportion exceeds 100 parts by weight on the other hand, the softening point of the composition as a whole is lowered, and so such a composition tends to cause a problem that it is difficult to retain the shape during a heating treatment upon forming a pattern.

The compound having at least 2 epoxy groups in the molecule itself may not have alkali-solubility.

In the radiation-sensitive resin composition according to the present invention, a surfactant may be contained for purposes of improvement in coating ability, such as reduction of the tendency to cause striation and improvement in the developability of an irradiated portion after formation of a dried coating, i.e., improvement in the alkali-solubility. Examples of the surfactant include polyoxyethylene alkyl ethers such as polyoxyethylene lauryl ether, polyoxyethylene stearyl ether and polyoxyethylene oleyl ether; polyoxyethylene aryl ethers such as polyoxyethylene octyl phenyl ether and polyoxyethylene nonyl phenyl ether; polyethylene glycol dialkyl esters such as polyethylene glycol dilaurate and polyethylene glycol distearate; other nonionic surfactants, fluorine-containing surfactants such as Eftop EF301, 303 and 352 (products of New Akita Chemical Company), Megaface F171, 172 and 173 (products of Dainippon Ink & Chemicals, Incorporated), Fluorad FC430 and 431 (products of Sumitomo 3M Limited), and Asahiguard AG710, Surflon S-382, SC-101, 102, 103, 104, 105 and 106 (products of Asahi Glass Co., Ltd.), and acrylic or methacrylic (co) polymers, Polyflow Nos. 57 and 95 (products of Kyoeisha Chemical Co., Ltd.).

The proportion of these surfactants used is generally preferably at most 0.4 parts by weight, more preferably at most 0.2 parts by weight per 100 parts by weight in terms of solids of the composition.

In the radiation-sensitive resin composition according to the present invention, an adhesive aid may be contained as an additive for the purpose of improving the adhesion or adhesive property to a substrate.

In the radiation-sensitive resin composition according to the present invention, an antistatic agent, shelf stabilizer, antifoaming agent and/or the like may be further contained as needed.

The radiation-sensitive resin composition according to the present invention can be prepared by uniformly mixing the above-described components (A), (B) and (C) and other components contained as needed. For example, the respective components may preferably be dissolved in a proper organic solvent to prepare a composition solution which is used as a liquid material for formation of an insulation film. As the organic solvent, may be preferably used that dissolving the respective components therein, not reacting with these components and having a proper vapor pressure. The liquid material for formation of an insulation film may be a dispersion that a part or all of the components are dispersed in a proper organic solvent.

Specific examples of such organic solvents, may be mentioned glycol ethers such as ethylene glycol monomethyl ether and ethylene glycol monoethyl ether; ethylene glycol alkyl ether acetates such as methyl cellosolve acetate and ethyl cellosolve acetate; diethylene glycol alkyl ethers such as diethylene glycol monomethyl ether and diethylene glycol monoethyl ether; propylene glycol alkyl ether acetates such as propylene glycol methyl ether acetate, propylene glycol ethyl ether acetate and propylene glycol propyl ether acetate; aromatic hydrocarbons such as toluene and xylene; ketones such as methyl ethyl ketone, cyclohexanone, 2-heptanone and methyl isobutyl ketone; and esters such as methyl 2-hydroxypropionate, ethyl 2-hydroxypropionate, methyl 2-hydroxy-2-methylpropionate, ethyl 2-hydroxy-2-methylpropionate, ethyl ethoxyacetate, ethyl oxyacetate, methyl 2-hydroxy-3-methylbutanoate, 3-methyl-3-methoxybutyl acetate, 3-methyl-3-methoxybutyl propionate, 3-methyl-3-methoxybutyl butyrate, ethyl acetate, butyl acetate, methyl 3-methoxypropionate, ethyl 3-methoxy-propionate and butyl 3-methoxypropionate. These organic solvents may be used either singly or in any combination thereof.

An organic solvent to which a high-boiling solvent such as benzyl ethyl ether, dihexyl ether, diethylene glycol monobutyl ether, acetonylacetone, isophorone, capronic acid, caprylic acid, 1-octanol, 1-nonanol, benzyl alcohol, benzyl acetate, ethyl benzoate, diethyl oxalate, diethyl maleate, γ-butyrolactone, ethyl carbonate, propylene carbonate, phenyl cellosolve acetate or carbitol acetate is added may also be used as needed.

The radiation-sensitive resin composition according to the present invention can be prepared in the form of a liquid by using such an organic solvent as described above and dissolving the respective components of the composition in the solvent so as to give a solid concentration of, for example, 20 to 40% by mass. The composition solution may also be used after it is filtered through a filter having a pore size of, for example, about 0.2 µm as need.

An exemplary process for forming a patterned insulation film using the radiation-sensitive resin composition according to the present invention will hereinafter be described.

(1) Coating Forming Step:

The components (A), (B) and (C) for the radiation-sensitive resin composition and other components to be contained as needed are first dissolved in an organic solvent to prepare a composition solution having a solid concentration of, for example, 20 to 40% by mass, the composition solution is applied to the surface of a substrate, and the solvent is removed by conducting pre-bake, thereby forming a coating for formation of an insulation film formed of the radiation-sensitive resin composition.

No particular limitation is imposed on the application method or coating means of the composition solution. Various kinds of methods, for example, spray coating, roll coating, spin coating and cast coating methods, etc. may be used.

The temperature of the pre-bake varies according to the kind, molecular weight and the like of the water-repellent siloxane resin used, and is preferably 60 to 120° C., more preferably 70 to 110° C. when certain water-repellent siloxane resin is used. If the temperature of the pre-bake is too low, the degree of migration of the water-repellent siloxane resin toward the surface layer side in the step of the pre-bake becomes insufficient, so that a certain quantity of the water-repellent siloxane resin also comes to remain in an exposed region, and so there is a possibility that sufficient hydrophilicity may not be achieved in the exposed region after post-bake. If the temperature of the pre-bake is too high on the other hand, the water-repellent siloxane resin bleeds out to the surface during the step of the pre-bake, so that the water-repellent siloxane resin in an unexposed region is removed in a developing step, and so there is a possibility that sufficient water repellency may not be achieved in the unexposed region after post-bake, and moreover in some cases, it may involve defect that solubility of the whole coating in a developing solution is lowered, and consequently exposure sensitivity is lowered.

In practice, the pre-bake is preferably performed at a temperature of, for example, 70 to 90° C. for about 1 to 15 minutes according to the kinds and mixed proportions of the respective components, and the like.

(2) Exposing and Developing Step:

After the coating formed is then irradiated with radiation such as ultraviolet rays through a mask of proper pattern, a developing treatment is performed with a developing solution, thereby removing the irradiated portion (exposed region) of the coating to form a prescribed pattern.

As a developing method, may be used any of, for example, liquid-banking method, dipping method and shower method. The developing time is generally 30 to 180 seconds.

As the developing solution used in the developing treatment, may be used an aqueous solution of an alkali, for example, an aqueous solution of an inorganic alkali such as sodium hydroxide, potassium hydroxide, sodium carbonate, sodium silicate, sodium metasilicate or ammonia; a primary amine such as ethylamine or n-propylamine; a secondary amine such as diethylamine or di-n-propylamine; a tertiary amine such as trimethylamine, methyldiethylamine, dimethylethylamine or triethylamine; a tertiary amine such as dimethylethanolamine, methyldiethanolamine or triethanolamine; a cyclic tertiary amine such as pyrrole, piperidine, N-methylpiperidine, N-methylpyrrolidine, 1,8-diazabicyclo[5.4.0]-7-undecene or 1,5-diazabicyclo[4.3.0]-5-nonene; an aromatic tertiary amine such as pyridine, collidine, lutidine or quinoline; or a quaternary ammonium salt such as tetramethylammonium hydroxide or tetraethylammonium hydroxide.

An aqueous solution obtained by adding a water-soluble organic solvent such as methanol or ethanol and/or a surfactant to the above-described aqueous solution of alkali may also be used as the developing solution.

(3) Heating Step:

After the developing treatment, a water flow cleaning treatment is performed, for example, for 30 to 90 seconds to remove unnecessary fragments, the thus-treated substrate is air-dried with, for example, compressed air or compressed nitrogen gas, the whole surface of the substrate is irradiated with radiation such as ultraviolet rays, and post-bake is then conducted by means of a heating device such as a hot plate or oven.

The temperature of the post-bake varies according to the kind, molecular weight and the like of the water-repellent siloxane resin, and is preferably 150 to 250° C., more preferably 200 to 230° C. when a certain water-repellent siloxane resin is used. If the temperature of the post-bake is too low, the degree of migration of the water-repellent siloxane resin toward the surface layer side becomes insufficient, and so there is a possibility that sufficient water repellency may not be achieved in the unexposed region after the post-bake. If the temperature of the post-bake is too high on the other hand, the resulting insulation film may be carbonized and colored, or the strength of the film may be weakened.

In practice, the post-bake is preferably performed at a temperature of, for example, 180 to 250° C. for a prescribed period of time, for example, for 5 to 30 minutes when a hot plate is used, or for 30 to 90 minutes when an oven is used.

An insulation film having basically various preferable properties such as insulating property, heat resistance and solvent resistance and a patterned surface varying in the degree of water repellency can be formed in such a manner.

More specifically, in the step of removing the solvent in the composition solution coated in the coating forming step, the water-repellent siloxane resin contained in the radiation-sensitive resin composition migrates toward the surface layer side according to the mobility thereof, so that the coating for formation of an insulation film becomes a state that the existence density of the water-repellent siloxane resin at the surface layer portion thereof is high. Such a state is surely and smoothly achieved by conducting the removal of the solvent under heating.

Figure 5:
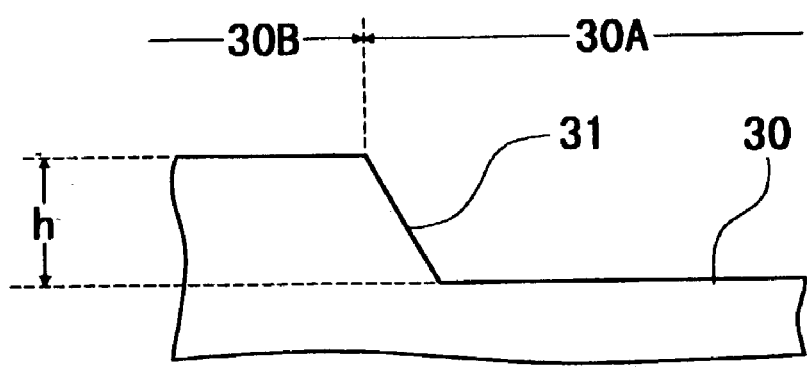
FIG. 5 is an enlarged cross-sectional view illustrating a state of a boundary portion of a conductor layer-forming region and another surface region than the conductor layer-forming region in the surface of an interlayer insulation film.

The surface layer portion in the exposed region of the coating for formation of an insulation film is removed by the developing treatment, whereby the surface level of the exposed region 30A becomes lower than the unexposed region 30B as illustrated in FIG. 5 to form a difference 31 in level at a boundary between both regions, while the exposed region 30A after removal of the surface layer becomes a state that the content of the water-repellent siloxane resin in the surface is low because the surface layer portion removed by the development is a portion high in content of the water-repellent siloxane resin.

The alkali-soluble copolymer of the component (A) in the coating for formation of an insulation film is crosslinked by the heating treatment to form the insulation film. By this heating treatment, the water-repellent siloxane resin in the unexposed region bleeds out to the surface thereof. As a result, a high water-repellent region high in content of the water-repellent siloxane resin at the surface is formed by the unexposed region. On the other hand, such bleeding out as in the unexposed region does not occur in the exposed region because the content of the water-repellent siloxane resin is low, so that the exposed region becomes a low water-repellent region low in content of the water-repellent siloxane resin at the surface.

As described above, according to the radiation-sensitive resin composition of the present invention, there can be formed a patterned insulation film having surface regions different in water repellency or wettability from each other by using a sole material and conducting patterning exposure and developing treatment without performing a particular surface-modifying treatment, and thus can be formed a patterned insulation film in a state that a liquid material, for example, a liquid conductive material, liquid material for color filter or liquid material for organic EL, remains in only the surface region high in wettability, in which a desired functional film should be formed, and does not remain in any other region than said surface region, by conducting only a process that such a liquid material is applied on to the whole upper surface of the insulation film by an ordinary method and dried. In addition, a conductor layer-forming region can be partitioned by the difference in level to prevent the liquid material from flowing into any other surface region than the conductor layer-forming region, whereby various kinds of liquid materials can be self-conformably patterned.

The radiation is irradiated in a pattern with a controlled exposure in the exposure treatment, whereby the conductor layer-forming region which is the exposed region is made to a state that a difference in contact angle between a contact angle of the conductor layer-forming region with purified water and a contact angle of any other surface region of the unexposed region than the conductor layer-forming region with purified water is at least 20°, or to a state that a difference in film thickness after the development between the exposed region and the unexposed region, i.e., the height of a difference in level at a boundary between the exposed region and the unexposed region is at least 0.2 $\mu$m, so that the patterned insulation film obtained by the radiation-sensitive resin composition becomes excellent in pattern-forming ability that when any of various kinds of liquid materials is applied, the liquid material is patterned in correspondence to the pattern of the insulation film.

More specifically, when an experiment as described below was conducted, it was confirmed that a liquid conductive material can be applied only to a desired conductor layer-forming region at a percentage of success of substantially 100%, i.e., selectively coated when the exposure treatment is performed in the above-described manner.

<Experimental Example>

A mask 10 having a pattern as illustrated in FIG. 1 was produced. This mask 10 is formed in a shape such that a plurality of rectangular openings 10A each corresponding to a pixel part of 100 $\mu$m wide and 300 $\mu$m long are formed in a state that a distance d between adjacent openings is 5 $\mu$m in both vertical and lateral directions.

After a composition solution containing the radiation-sensitive resin composition according to the present invention was applied on to a glass substrate to form a coating having a dry film thickness of 4 $\mu$m, the mask 10 was arranged on this coating to conduct an exposure treatment. A developing treatment was then conducted, thereby forming an insulation film in which a pattern of pixel parts corresponding to the opening 10A of the mask 10 was formed by a low water-repellent region. A liquid conductive material was then applied to the whole surface of the patterned insulation film by means of a spin coating method, thereby forming conductor layers.

A condition of separation between pixel parts was then judged through an optical microscope. The judgment was conducted by observing any 100 points at random within the substrate to count points successful in selective coating.

Figure 2:
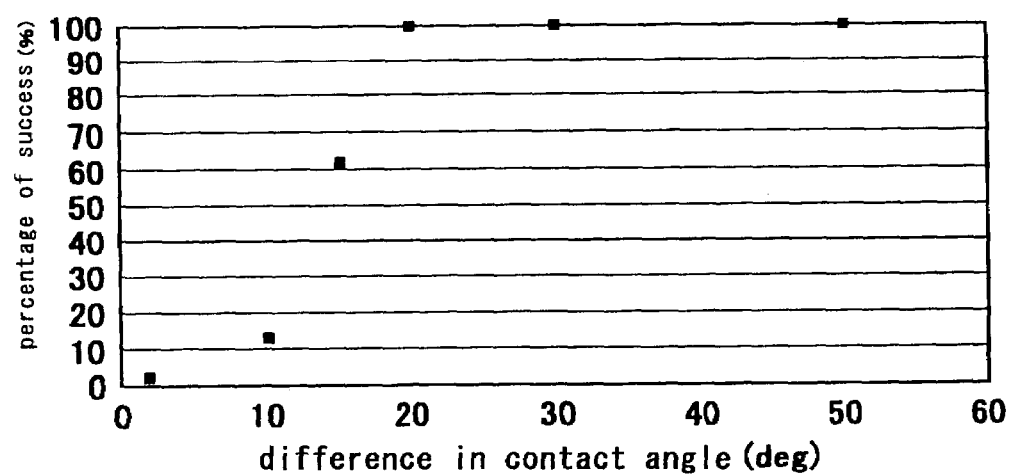
FIG. 2 diagrammatically illustrates the relationship between a difference in contact angle with purified water between an exposed region and an unexposed region, and the percentage of success of selective coating of the liquid material.

Exposure conditions were suitably changed to control the degree of a difference in contact angle between a contact angle of the exposed region (irradiated portion) with purified water and a contact angle of the unexposed region (light-screening portion) with purified water, thereby conducting the same judgment as described above. The result is shown in FIG. 2.

Figure 3:
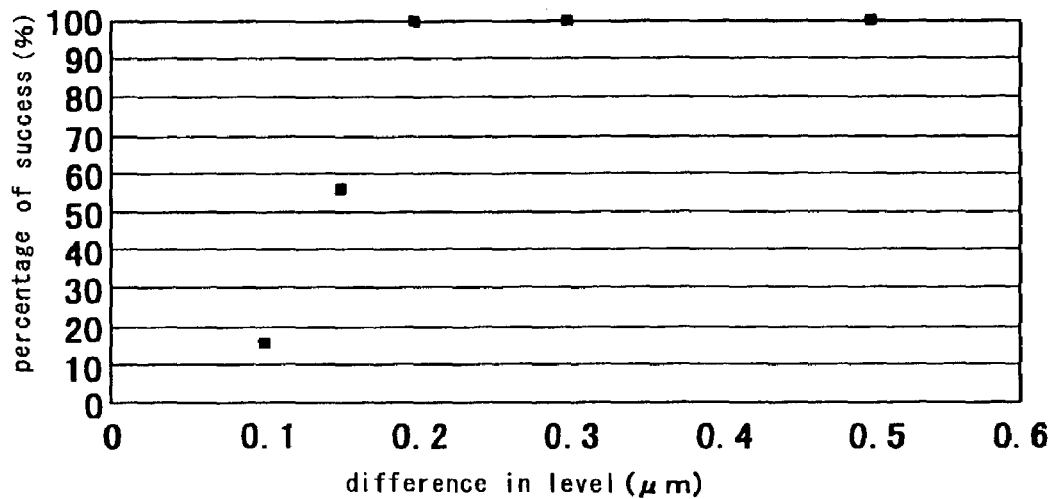
FIG. 3 diagrammatically illustrates the relationship between a difference in level between the exposed region and the unexposed region, and the percentage of success of selective coating of the liquid material.

Exposure conditions were also suitably changed to control a difference (h in FIG. 5) in film thickness after the developing treatment between the exposed region and the unexposed region, thereby conducting the same judgment as described above. The result is shown in FIG. 3.

As described above, according to the radiation-sensitive resin composition of the present invention, there is no need to perform a step of forming bank layers having water repellency and a surface-modifying treatment, which have heretofore been required or indispensable, in the case where conductor layers or the like are formed with a liquid material, so that a desired insulation film can be formed with ease by fewer treatment steps and high precision to advantageously produce a flat-panel display device such as a liquid crystal display device.

In addition, there is no need to perform treatments for controlling the conductor layers to a desired form, such as a photographic step, etching treatment and removing step, which have been required in the conventional production processes, so that desired conductor layers can be formed by a single process.

A display element and a flat-panel display device produced by the radiation-sensitive resin composition according to the present invention will hereinafter be described.

[Active Matrix Board]

Figure 4:
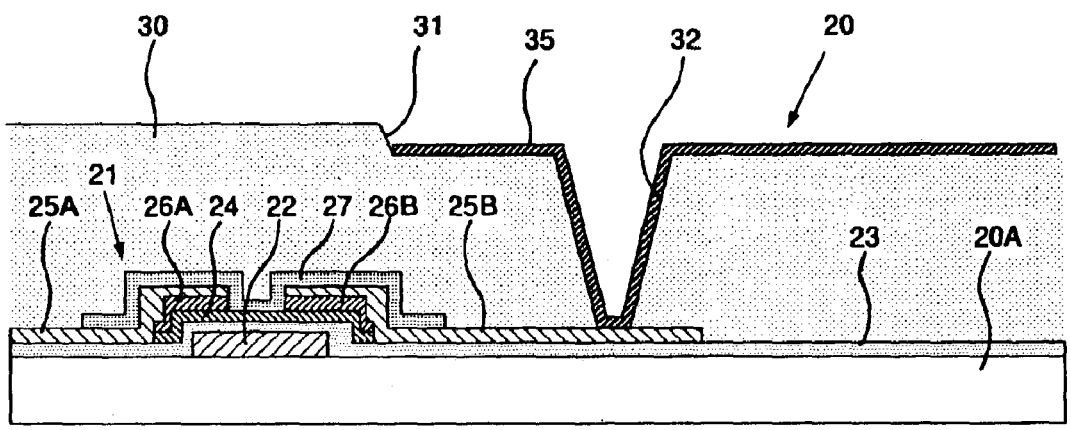
FIG. 4 is a cross-sectional view schematically illustrating the construction of an exemplary active matrix board according to the present invention.

FIG. 4 is a cross-sectional view schematically illustrating the construction of an exemplary active matrix board according to the present invention, and FIG. 5 is an enlarged cross-sectional view illustrating a state of a boundary portion between a conductor layer-forming region and another surface region than the conductor layer-forming region in the surface of an interlayer insulation film.

This active matrix board 20 comprises an insulation substrate 20A composed of, for example, a transparent glass substrate, on the surface of which an active matrix circuit (not illustrated) is formed by arranging plural scanning lines and plural data lines in the form of a matrix and providing switching elements 21 in the vicinity of respective positions at which the scanning line and the data line intersect, an interlayer insulation film 30 formed on the insulation substrate 20A so as to cover the active matrix circuit, and transparent electrode films 35 composed of, for example, ITO, which are conductor layers formed on the interlayer insulation film 30 in a state connected to the respective switching elements 21.

The switching element 21 is composed of, for example, TFT element that is constructed by a gate electrode 22 connected to a gate wiring, a gate insulation film 23 for insulating the gate electrode 22 from other components, a semiconductor layer 24 formed on the surface of the gate insulation film 23 so as to be placed over the gate electrode 22, a source electrode 25A to which signal voltage is supplied from a data line, a drain electrode 25B which supplies signal voltage to the transparent electrode film 35 making up a pixel electrode by connected at a contact hole 32, an ohmic contact layer 26A composed of, for example, $n^+$ Si for connecting the semiconductor layer 24 to the source electrode 25A, an ohmic contact layer 26B composed of, for example, $n^+$ Si for connecting the semiconductor layer 24 to the drain electrode 25B, and a protective layer 27 for protecting the whole TFT element.

The interlayer insulation film 30 constructing making up this active matrix board is formed by using the radiation-sensitive resin composition described above in accordance with the process described above.

In this interlayer insulation film 30, are formed conductor layer-forming regions 30A, in which the transparent electrode films 35 are to be formed, and difference in level for partitioning its corresponding conductor layer-forming region 30A and surface region 30B. Besides, contact holes 32 each of which serves to connect the transparent electrode film 35 making up the pixel electrode formed on the interlayer insulation film 30 to the drain electrode 25B in the TFT element 21 are formed.

The conductor layer-forming region 30A in the interlayer insulation film 30 is a low water-repellent region by the exposed region which has been irradiated with radiation in the exposure treatment, and the other surface region 30B is a high water-repellent region by the unexposed region which has been irradiated with no radiation in the exposure treatment. Accordingly, the surface wettability in the exposed region is higher than that in the unexposed region.

The exposed region preferably has high surface wettability compared with the unexposed region in such a manner that a difference in contact angle between the contact angle of the exposed region with purified water and the contact angle of the unexposed region with purified water is at least 20°. The liquid conductor layer-forming material can be thereby applied only to the conductor layer-forming region that is the exposed region, and so the pattern formation can be performed with high precision and certainty.

The height h of the difference 31 in level for partitioning the exposed region and the unexposed region is preferably, for example, at least 0.2 $\mu$m. The liquid conductor layer-forming material can be thereby applied only to the conductor layer-forming region that is the exposed region, and so the pattern formation can be performed with high precision and certainty.

Such an active matrix board as described above is produced, for example, in the following manner.

A composition solution of the radiation-sensitive resin composition as above is first prepared in the above-described manner, and an insulation film-forming material composed of this composition solution is applied on to an insulation substrate 20A, on the surface of which an active matrix circuit has been provided, and the solvent is removed by conducting pre-bake, thereby forming a coating composed of the radiation-sensitive resin composition.

The coating is irradiated with radiation in a state that other surface regions 30B than conductor layer-forming regions 30A in the coating have been light-screened by means of a proper mask, thereby conducting a patterning exposure treatment.

The patterning exposure treatment to the coating is basically conducted by irradiating the conductor layer-forming regions 30A making up pixel parts with radiation in a state that an exposure has been controlled to an extent that only the surface layer portion of the coating is cured. However, it is preferred that contact hole-forming portions in the conductor layer-forming regions 30A be irradiated with radiation in a state that an exposure to the contact hole-forming portions has been controlled so as to become greater than that to other portions in the conductor layer-forming regions 30A. The exposure to the conductor layer-forming regions 30A forming the pixel parts is, for example, at least 10 mJ and at most 15 to 20 mJ, and the exposure to the portions of the conductor layer-forming region, in which the contact holes are to be formed, is, for example, 90 to 100 mJ.

The exposure treatment may be conducted either by performing exposure plural times using a plurality of masks different in pattern shape from each other or by performing exposure using a photomask whose transmittance partially varies in pattern.

Figure 6:
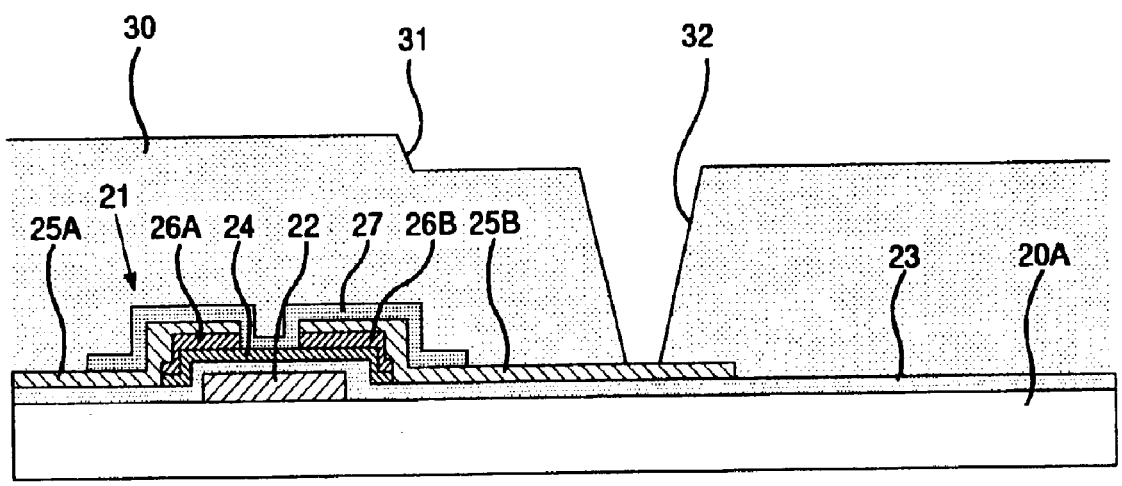
FIG. 6 is a cross-sectional view illustrating a state that an interlayer insulation film has been formed in a production process of the active matrix board shown in FIG. 4.

As illustrated in FIG. 6, surface layer portion and contact hole-forming portion of the coating cured by the exposure are removed by conducting the developing treatment with a developing solution, thereby forming a difference 31 in level partitioning the exposed region and unexposed regions that are different in surface wettability from each other, and a contact hole 32, through which a part of a drain electrode 25B is exposed, is formed. Thereafter, a cleaning treatment with running water, a drying treatment and post-bake are performed, thereby forming an interlayer insulation film 30.

A conductor layer-forming material in a form of liquid by dissolving in a proper solvent is then applied on to the whole surface of the interlayer insulation film 30, the conductor layer-forming material is pre-calcined to remove the solvent, and a substantial calcining treatment is performed, thereby forming transparent electrode films 35 respectively making up pixel electrodes, thus the active matrix board 20 illustrated in FIG. 4 is produced.

In the above-described process, the pre-calcining treatment is preferably conducted, for example, at a temperature of 80 to 100° C. for 1 to 3 minutes, and the substantial calcining treatment is preferably conducted, for example, at a temperature of 160 to 220° C. for 10 to 30 minutes.

[Flat-Panel Display Device]

The flat-panel display device according to the present invention comprises the active matrix board, in which the interlayer insulation film has been formed with the radiation-sensitive resin composition according to the present invention, and an opposite board, for example, a color filter board or the like, arranged in opposed relation to each other and having opposite electrodes which are opposed to the respective transparent electrode films in the active matrix board, and an optically controlling member is held between the active matrix board and the opposite board. The optically controlling member herein is, for example, a liquid crystal material, a film-like liquid crystal or the like whose optical properties are changed by voltage applied or electric current supplied.

When a color filter material is directly provided on each transparent electrode film in the active matrix board, there is no need to provide any color filter on the opposite board.

When the color filter material itself has conductivity, there is no need to provide any transparent electrode film on the active matrix board.

Figure 7:
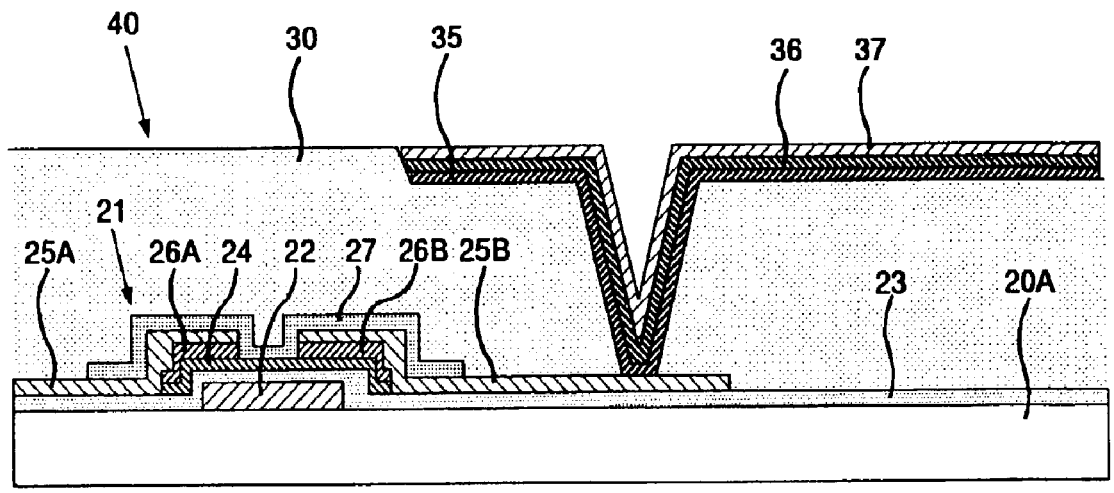
FIG. 7 is a cross-sectional view schematically illustrating the construction of an exemplary organic thin film light-emitting element board according to the present invention.

As illustrated in FIG. 7, the flat-panel display device according to the present invention may also comprises an organic thin film light-emitting element board 40 obtained by forming an organic semiconductor film 36 on the upper surface of each transparent electrode film 35 in the active matrix board 20, in which the interlayer insulation film 30 has been formed with the radiation-sensitive resin composition according to the present invention, and further, forming an opposite electrode film 37 on the upper surface of the organic semiconductor film 36. The opposite electrode film can be formed by a material usable as the material forming the transparent electrode films in the active matrix board.

The organic thin film light-emitting element board 40 of such construction can be produced by forming the organic semiconductor films 36 and the opposite electrode films 37 in this order on the respective transparent electrode films 35 in accordance with the same process as the conductor layer-forming step for forming the transparent electrode films 35 on the interlayer insulation film 30 in the production process of the active matrix board as described above.

Figure 8:
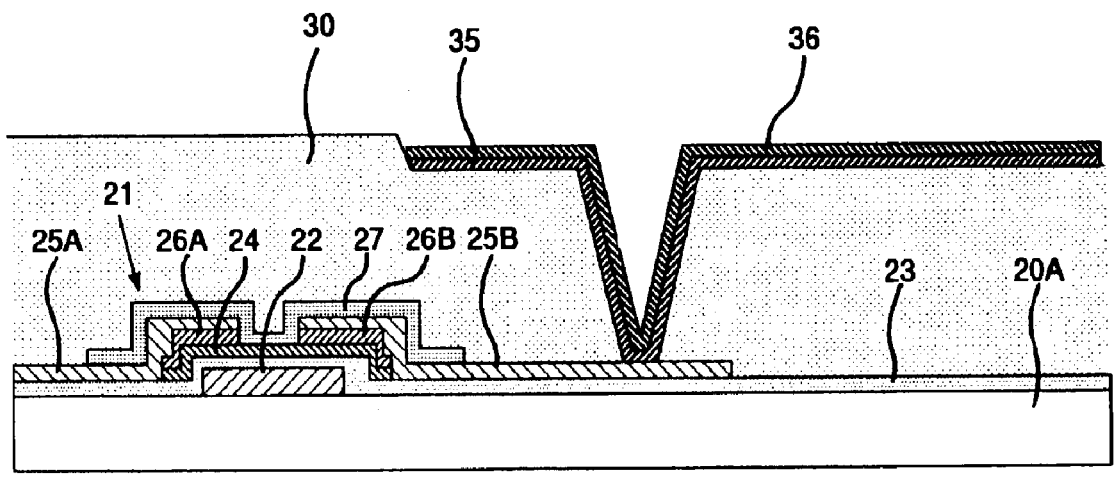
FIG. 8 is a cross-sectional view illustrating a state that an organic semiconductor film has been formed in a production process of the organic thin film light-emitting element board shown in FIG. 7.

Specifically, as illustrated in FIG. 8, a liquid organic semiconductor film-forming material is applied on to the transparent electrode films 35 in the active matrix board 20 by, for example, an ink-jet method or the like, the organic semiconductor film-forming material is calcined, thereby forming the organic semiconductor films 36, a liquid opposite electrode film-forming material is applied thereafter on to the organic semiconductor films 36 by, for example, an ink-jet method or the like, the opposite electrode film-forming material is calcined, thereby forming the opposite electrode films 37, whereby the organic thin film light-emitting element board 40 illustrated in FIG. 7 is produced.

The thin film light-emitting device board may also be provided as the construction that an electron transmitting layer and/or a hole transmitting layer are provided between the transparent electrode film 35 or the opposite electrode film 37 and the organic semiconductor film 36.

EXAMPLES

The present invention will hereinafter be described specifically by the following examples. However, the present invention is not limited to these examples. Incidentally, all designations of "%" as will be used in the following examples mean % by mass.

(1) Synthesis of Alkali-Soluble Copolymer (Component (A)):

Synthesis Example 1

A separable flask equipped with a condenser tube, a nitrogen gas inlet tube and a thermometer was charged with 6 parts by weight of N,N'-azobisisobutyronitrile and 250 parts by weight of diethylene glycol dimethyl ether, and successively charged with 5 parts by weight of styrene, 15 parts by weight of methacrylic acid, 45 parts by weight of glycidyl methacrylate and 30 parts by weight of tricyclo-[5,2,1,0$^{2,6}$]decan-8-yl methacrylate. After purged with nitrogen gas, 5 parts by weight of 1,3-butadiene were charged, and the contents were slowly stirred. The temperature of the resultant solution was raised to 80° C., and the solution was held at this temperature for 5 hours to synthesize a resin. The solid concentration of the resultant polymer solution was 35.5%. This resin will hereinafter be referred to as "Copolymer (A-1)". The weight average molecular weight Mw in terms of polystyrene of this copolymer was measured and the average molecular weight Mw of Copolymer (A-1) was 15,000.

Synthesis Example 2

A separable flask equipped with a condenser tube, a nitrogen gas inlet tube and a thermometer was charged with 6 parts by weight of N,N'-azobisisobutyronitrile and 300 parts by weight of diethylene glycol dimethyl ether, and successively charged with 25 parts by weight of styrene, 16 parts by weight of methacrylic acid, 45 parts by weight of glycidyl methacrylate and 14 parts by weight of tricyclo-[5,2,1,0$^{2,6}$]decan-8-yl methacrylate. After purged with nitrogen gas for 30 minutes, the separable flask was put into an oil bath to raise the temperature of the resultant solution to 70° C., and polymerization was conducted for 6 hours with stirring to synthesize a resin. The solid concentration of the resultant polymer solution was 32.0%. This resin solution will hereinafter be referred to as "Copolymer (A-2)". The weight average molecular weight Mw in terms of polystyrene of this copolymer was measured by means of a GPC chromatograph HLC-8020 (manufactured by Toyo Soda Co., Ltd.) and the average molecular weight Mw of Copolymer (A-2) was 16,000.

(2) Formation of Coating:

Example 1

After 100 parts by weight of Copolymer (A-1) as a component (A), 30 parts by weight of a condensate of 2,3,4-trihydroxybenzophenone (1 mol) and 1,2-naphthoquinonediazide-5-sulfonic acid chloride (2.6 mol) as a component (B) and 0.5 parts by weight of "SH28PA" (product of Dow Corning Toray Silicone Co., Ltd.) as a component (C) were mixed and dissolved in diethylene glycol dimethyl ether so as to give a solid concentration of 35% as a whole, the resultant solution was filtered through a membrane filter having a pore size of 0.2 µm to prepare a composition solution of a radiation-sensitive resin composition according to the present invention.

After the composition solution prepared was applied on to a glass substrate by means of a spinner, the thus-applied solution was pre-baked at a temperature of 80° C. for 1 minutes on a hot plate to form a coating having a film thickness of 4.0 µm.

The coating obtained in such a manner was irradiated with ultraviolet rays (mixed light of g-, h- and i-line) through a mask of a pattern having light-screening portions 1 cm wide by means of "Aligner PLA501F" (manufactured by Canon Inc.) in a state that an exposure by i-line (wave length: 365 nm) was 500 J/m$^2$. After a developing treatment was then conducted with a 0.50% aqueous solution of tetramethylammonium hydroxide at 25° C. for 80 seconds, a rinsing treatment (cleaning treatment) was performed with purified water for 1 minute. After the coating was additionally irradiated with the mixed light of g-, h- and i-line in a state that an exposure by i-line (wave length: 365 nm) was 3000 J/m$^2$, the coating was heated at a temperature of 220° C. for 60 minutes by means of an oven to perform post-bake, thereby obtaining a glass substrate on which a patterned insulation film having differences in level partitioning exposed regions and unexposed regions had been formed. The film thickness of the remaining pattern portion that is the unexposed region was 3.8 µm, the film thickness of the exposed region was 2.0 µm, and the height of the difference in level was 1.8 µm in the glass substrate.

(1) Evaluation of Sensitivity:

Evaluation was made on the basis of an exposure required for forming a pattern that the film thickness of an exposed region after post-bake was 2.0 µm. It may safely be said that the sensitivity is good when the exposure is not greater than 5,000 J/m$^2$. The exposure was shown in the following Table 1.

(2) Evaluation of Heat Resistance:

After the glass substrate, on which the patterned insulation film had been formed, was further heated for 30 minutes in an oven controlled at 250° C., the film thickness of the insulation film was measured. The rate of change in film thickness of the heated insulation film to the film thickness of the insulation film before the heating treatment was determined. The result is shown in Table 1. It may safely be said that the heat resistance is good when the absolute value of this value falls within 5%.

(3) Evaluation of Solvent Resistance:

After the glass substrate, on which the patterned insulation film had been formed, was immersed for 20 minutes in dimethyl sulfoxide controlled at a temperature of 70° C., the film thickness of the insulation film was measured. The rate of change in film thickness of the treated insulation film to the film thickness of the insulation film before the treatment with the solvent was determined to evaluate the insulation film as to the change in film thickness after immersed in the solvent. The result is shown in Table 1. It may safely be said that the solvent resistance is good when the absolute value of this value is smaller than 5%.

(4) Evaluation of Contact Angle with Purified Water (Surface Wettability):

Purified water (10 mg) was dropped on each surface of the remaining pattern portion that is the unexposed region and the exposed region to measure contact angles by means of a contact angle meter (type "CA-X", manufactured by Kyowa Interface Science Co., Ltd.). The result is shown in Table 1. It may safely be said that the pattern-forming ability is good for various kinds of liquid materials applied on to the patterned insulation film, when a difference in contact angle between the contact angle of the unexposed region and the contact angle of the exposed region is at least 20°.

Example 2

A composition solution of a radiation-sensitive resin composition according to the present invention was prepared in the same manner as in Example 1 except that 100 parts by weight of Copolymer (A-2) prepared in Synthesis Example 2 were used as the component (A) in place of 100 parts by weight of Copolymer (A-1) in Example 1, and the same process as in Example 1 was performed with this composition solution to form a patterned insulation film, as well as the insulation film was evaluted. The results are-shown in Table 1.

Example 3

A composition solution of a radiation-sensitive resin composition according to the present invention was prepared in the same manner as in Example 1 except that 30 parts by weight of a condensate of 4,4'-[1-[4-[1-[ 4-hydroxyphenyl]-1-methylethyl]phenyl]ethylidene]bisphenol (1 mol) and 1,2-naphthoquinonediazido-5-sulfonic acid chloride (2 mol) were used as the component (B) in place of 30 parts by weight of the condensate of 2,3,4-trihydroxybenzophenone (1 mol) and 1,2-naphthoquinonediazide-5-sulfonic acid chloride (2.6 mol) in Example 1, and the same process as in Example 1 was performed with this composition solution to form a patterned insulation film, as well as the insulation film was evaluated. The results are shown in Table 1.

Example 4

A composition solution of a radiation-sensitive resin composition according to the present invention was prepared in the same manner as in Example 1 except that 0.3 parts by weight of "SH3771" (product of Dow Corning Toray Silicone Co., Ltd.) were used as the component (C) in place of 0.5 parts by weight of "SH28PA" (product of Dow Corning Toray Silicone Co., Ltd.) in Example 1, and the same process as in Example 1 was performed with this composition solution to form a patterned insulation film, as well as the insulation film was evaluated. The results are shown in Table 1.

Comparative Example 1

A comparative composition solution of a radiation-sensitive resin composition was prepared in the same manner as in Example 1 except that the water-repellent siloxane resin of the Component (C) in Example 1 was not used, and the same process as in Example 1 was performed with this comparative composition solution to form a patterned insulation film, as well as the insulation film was evaluated. The results are shown in Table 1.

Comparative Example 2

A comparative composition solution of a radiation-sensitive resin composition was prepared in the same manner as in Example 1 except 0.3 parts by weight of that a fluorocarbon resin, "TFX-25" (product of NEOS Company Limited), was used in place of the water-repellent siloxane resin of the Component (C) in Example 1, and the same process as in Example 1 was performed with this comparative composition solution to form a patterned insulation film, as well as the insulation film was evaluated. The results are shown in Table 1.

TABLE 1

| | Sensitivity ($J/m^2$) | Heat resistance (%) | Solvent resistance (%) | Contact angle with purified water (degree) | | difference in contact angle- ("exposed) region" − "unexposed region" (degree) |
|---|---|---|---|---|---|---|
| | | | | exposed region | unexposed region | |
| Example 1 | 500 | −3.5 | +3.5 | 96.1 | 69.2 | 26.9 |
| Example 2 | 600 | −3.7 | +4.1 | 94.6 | 68.5 | 26.1 |
| Example 3 | 800 | −3.2 | +3.8 | 93.2 | 69.0 | 24.2 |
| Example 4 | 550 | −3.4 | +3.9 | 92.5 | 70.4 | 22.1 |
| Comparative Example 1 | 500 | −3.9 | +4.3 | 68.5 | 67.2 | 1.3 |
| Comparative Example 2 | 500 | −3.6 | +4.0 | 70.3 | 67.5 | 2.8 |

As apparent from the above results, it was confirmed that the coatings for formation of an insulation film formed by the radiation-sensitive resin compositions according to the present invention are high in sensitivity, the resultant insulation films have excellent heat resistance and solvent resistance and are also excellent in pattern-forming ability with various kinds of liquid materials at the time such a liquid material is applied on to these patterned insulation films.

Example 5

The radiation-sensitive resin composition according to the present invention was used as a material for forming an interlayer insulation film in an active matrix board of the so-called TFT type to produce an active matrix board in accordance with the following Step 1 to Step 5.

(Step 1: Coating-forming Step)

Figure 9:
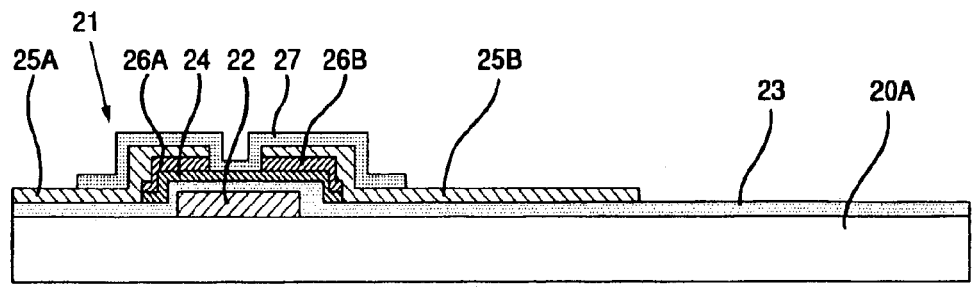
FIG. 9 is a cross-sectional view schematically illustrating the construction of an exemplary insulating substrate used upon production of an active matrix board and provided with a switching element composed of TFT.
Figure 10:
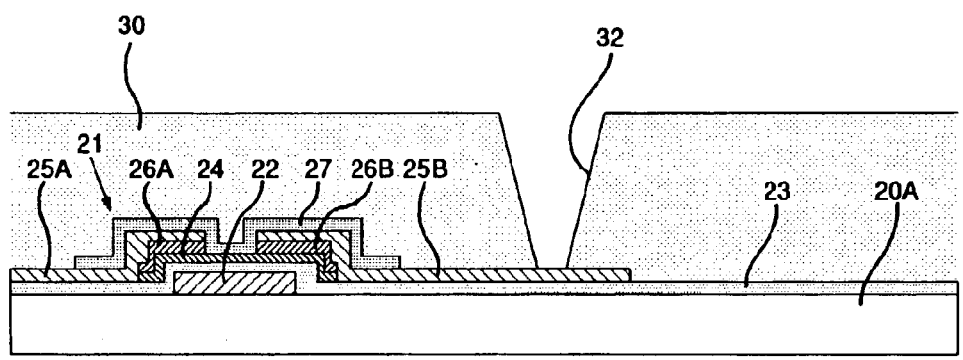
FIG. 10 is a cross-sectional view illustrating a state that an interlayer insulation film has been formed in an exemplary conventional production process of an active matrix board.
Figure 11:
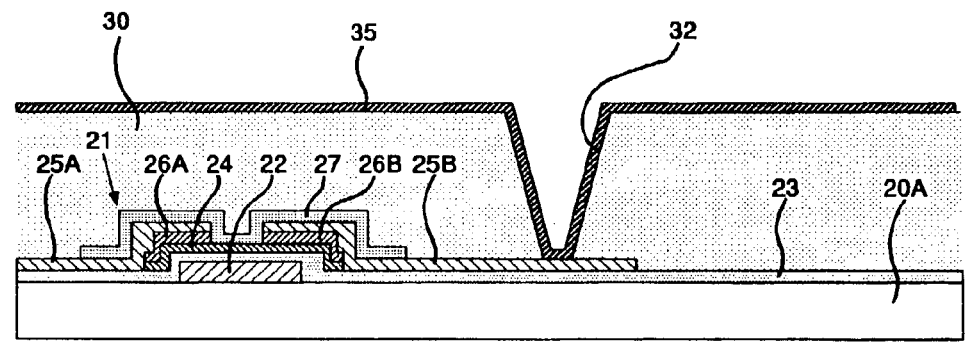
FIG. 11 is a cross-sectional view illustrating a state that a transparent electrode film has been formed on the interlayer insulation film shown in FIG. 10.
Figure 12:
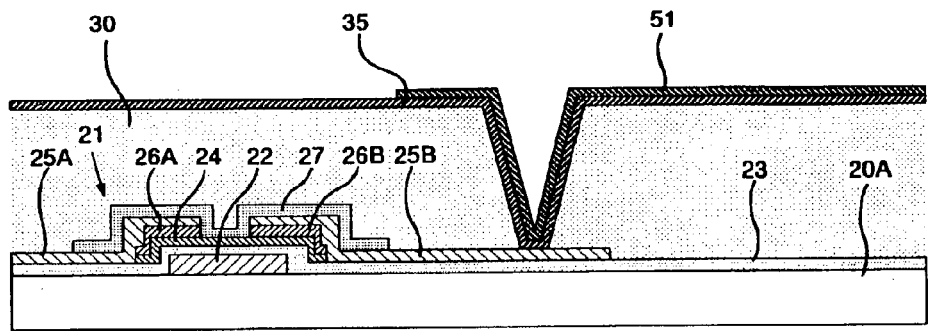
FIG. 12 is a cross-sectional view illustrating a state that a photoresist has been formed on the transparent electrode film shown in FIG. 11.
Figure 13:
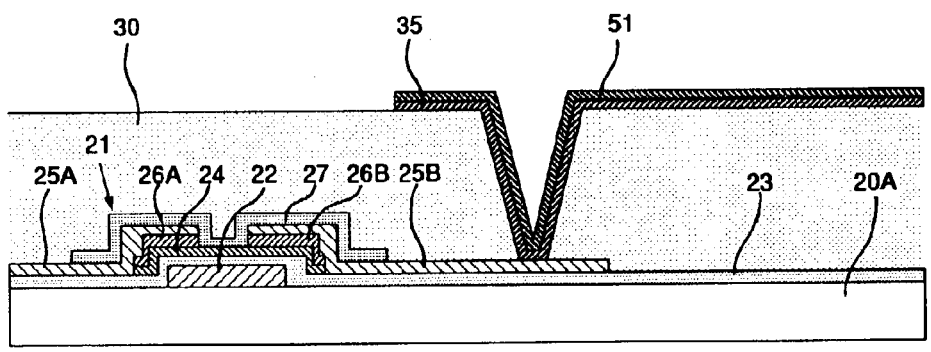
FIG. 13 is a cross-sectional view illustrating a state that a portion exposed to the surface in the transparent electrode film shown in FIG. 12 has been removed.
Figure 14:
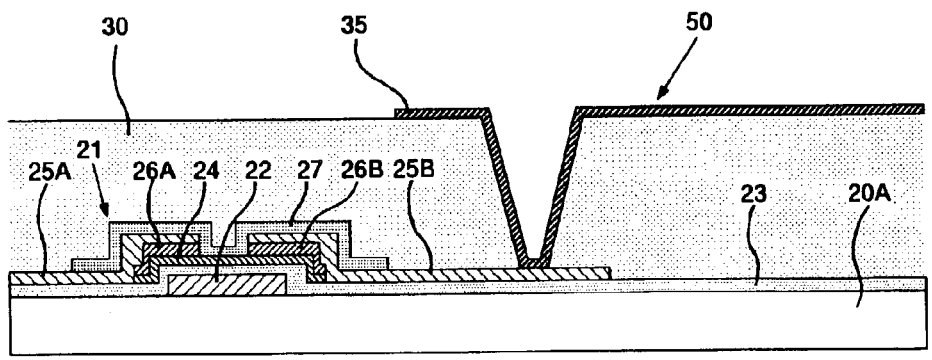
FIG. 14 is a cross-sectional view schematically illustrating the construction of an exemplary active matrix board produced by the process illustrated in FIGS. 11 to 13.

An active matrix circuit equipped with TFT elements as switching elements as illustrated in FIG. 9 was formed on a transparent glass substrate in accordance with a process preferably used heretofore, the composition solution of the radiation-sensitive resin composition according to the present invention obtained in Example 1 was applied on to the glass substrate by means of a spin coating method and pre-baked at a temperature of 90° C. for 2 minutes on a hot plate to form a coating having a film thickness of about 4 μm. The conditions for application of the composition solution were such that the spin speed is controlled to 700 rpm to conduct spinning for 10 seconds.

(Step 2: Exposing Step)

The coating thus formed was irradiated with ultraviolet rays in a state that other surface regions in the coating than conductor layer-forming regions had been light-screened by means of a slit mask, thereby conducting an exposure treatment by halftone exposure to form a pattern. The exposure treatment was conducted in such a condition that an exposure to pixel parts which is the conductor layer-forming regions is controlled to 200 $J/m^2$, and an exposure to contact hole portions in pixel parts is controlled to 1000 $J/m^2$.

(Step 3: Developing Step)

A developing treatment was then conducted with a 0.50% aqueous solution of tetramethylammonium hydroxide at 23° C. for 100 seconds by means of a liquid-banking method, and a water flow cleaning treatment with purified water was performed for 90 seconds, and a drying treatment by a spin drying method was then conducted.

(Step 4: Post-baking Step)

The coating was heated at a temperature of 150° C. for 30 minutes by means of an oven to perform post-bake, thereby obtaining an interlayer insulation film on which a desired pattern had been formed.

A difference in level between an exposed region forming a pixel part and an unexposed region in the interlayer insulation film obtained was 1 µm, a contact angle of the exposed region with purified water was 65°, a contact angle of the unexposed region with purified water was 90°, and a difference in contact angle between those of the exposed region and the unexposed region with purified water was 25°.

(Step 5: Transparent Electrode Film-forming Step)

After "Sumicefine R-307" (product of Sumitomo Osaka Cement Co., Ltd.) which is a liquid transparent electrode film-forming material, was applied on to the surface of the interlayer insulation film by means of a spin coating method, a pre-calcining treatment was immediately conducted at 100° C. for 5 minutes by means of a hot plate to remove the solvent. A substantial calcining treatment was then performed at 250° C. for 60 minutes by means of an oven, thereby forming pixel electrodes each composed of a transparent electrode film. In the above-described process, the application of the transparent conductor film-forming material was conducted by adding dropwise 10 ml of the transparent conductor film-forming material and spinning the substrate for 10 seconds at a spin speed of 500 rpm.

A TFT active matrix board was thus produced.

The TFT active matrix board obtained in the above-described manner was used to produce a liquid crystal display device, and this display device was operated. As a result, it was confirmed that it is excellent in display performance.

[Effect of Invention]

According to the radiation-sensitive resin compositions of the present invention, there can be formed patterned insulation films having surface regions different in water repellency or wettability from each other by using a sole material and conducting patterning exposure and developing treatment without performing a particular surface-modifying treatment, and thus can be formed insulation films having a pattern in a state that a liquid material, for example, a liquid conductive material, liquid material for color filter or liquid material for organic EL, remains in only the surface region high in wettability, in which a desired functional film is to be formed, and does not remain in any other region than said surface region by conducting only a process that such a liquid material is applied on to the whole upper surface of the insulation film by an ordinary method and dried, whereby various kinds of liquid materials can be self-conformably patterned.

Accordingly, there is no need to perform a step of forming bank layers having water repellency and a surface-modifying treatment, which have heretofore been required, in the case where conductor layers or the like are formed with a liquid material, so that a desired insulation film can be formed with ease by fewer treatment steps and high precision to advantageously produce a flat-panel display device such as a liquid crystal display device.

In addition, plural insulation film-forming steps and a surface-modifying treatment for bank layers, which are required upon application of a liquid material for an EL element or color filter by, for example, an ink-jet method or the like, become unnecessary, so that reduction in material cost, reduction in cost related to a production apparatus, improvement in production yield by a simplification of steps, etc. can be realized.

Further, irradiation of radiation is conduced in an exposure controlled to a state that a difference in contact angle between a contact angle of each conductor layer-forming region after the exposure treatment with purified water and a contact angle of any other surface region which is unexposed region than the conductor layer-forming region with purified water is at least 20° or irradiation of radiation is conducted in an exposure controlled to a state that a difference in residual film thickness between exposed regions and unexposed regions, i.e., a height of a difference in level between the exposed regions and the unexposed regions is at least 0.2 µm, whereby the patterned insulation film obtained by the radiation-sensitive resin composition can be made excellent in-pattern-forming ability that when any of various kinds of liquid materials is applied, the liquid material is patterned in correspondence to the pattern of the insulation film.

What is claimed is:

1. A radiation-sensitive resin composition, comprising:
   (A) 100 parts by weight of an alkali-soluble copolymer comprising in copolymerized form the following components (a), (b) and (c):
      (a) an unsaturated carboxylic acid,
      (b) a radical-polymerizable compound containing an epoxy group, and
      (c) any other radical-polymerizable compound than the components (a) and (b),
   (B) 5 to 100 parts by weight of a 1,2-quinonediazide compound, and
   (C) at least 0.1 parts by weight of a water-repellent siloxane resin.

2. A process for forming a patterned insulation film, comprising:
   applying a liquid material comprising the radiation-sensitive resin composition according to claim 1 to a substrate to form a coating,
   exposing through a patterning mask and developing the coating to remove a surface layer portion of an exposed region in the coating, and
   then subjecting the coating to a heating treatment, thereby forming a low water-repellent region wherein the content of the water-repellent siloxane resin at the surface is low in the exposed region and forming a high water-repellent region wherein the content of the water-repellent siloxane resin at the surface is high in an unexposed region.

3. A process for producing a flat-panel display device, comprising:
   forming an interlayer insulation film by applying a liquid material comprising the radiation-sensitive resin composition according to claim 1 on to a substrate to form a coating,
   subjecting the coating to a patterning exposure treatment in accordance with a pattern varying in an exposure, and
   subjecting the coating to a developing treatment to remove the coating in exposed regions, thereby forming a difference in level for partitioning its corresponding conductor layer-forming region and forming contact holes, and forming conductor layers by applying a conductor layer-forming material comprising a liquid material to the surface of the interlayer insulation film formed on the substrate;

wherein said flat-panel display device is equipped with a display element comprising said substrate, on the surface of which an active matrix circuit is formed by arranging plural scanning lines and plural data lines in the form of a matrix and providing switching elements in the vicinity of respective positions at which the scanning line and the data line intersect, said interlayer insulation film formed on the substrate so as to cover the scanning lines, the data lines and the switching elements, and said conductor layers formed on the interlayer insulation film in a state connected to the respective switching elements.

4. The process for producing the flat-panel display device according to claim 3, wherein the interlayer insulation film is formed by performing the patterning exposure treatment by controlling an exposure in such a manner that only surface layer portions are cured in a part of conductor layer-forming regions, in which the conductor layers should be formed in the coating for formation of an insulation film, and the whole in the thickness-wise direction thereof is cured in the other parts of the conductor layer-forming regions in a state that other surface regions than the conductor layer-forming regions have been screened from light, and then subjecting the coating to a developing treatment, thereby removing surface layer portions in the coating in a part of the conductor layer-forming regions, and removing the whole of the coating in the other parts of the conductor layer-forming regions to form the difference in level for partitioning the conductor layer-forming region and to form the contact holes.

5. The process for producing the flat-panel display device according to claim 3 or 4, wherein in the step of forming the interlayer insulation film, a difference in contact angle between a contact angle of each conductor layer-forming region with purified water and a contact angle of any other surface region than the conductor layer-forming region with purified water after the patterning exposure treatment is at least 20°.

6. The process for producing the flat-panel display device according to claim 3 or 4, wherein in the step of forming the interlayer insulation film, the height of the difference in level formed by the developing treatment is at least 0.2 $\mu$m.

7. The process for producing the flat-panel display device according to claim 5, wherein in the step of forming the interlayer insulation film, the height of the difference in level formed by the developing treatment is at least 0.2 $\mu$m.

8. The radiation-sensitive resin composition according to claim 1, wherein component (A) is capable of being crosslinked by heating.

9. The radiation-sensitive resin composition according to claim 1, wherein component (a) is methacrylic acid or acrylic acid.

10. The radiation-sensitive resin composition according to claim 1, wherein component (b) is glycidyl acrylate, glycidyl methacrylate or vinyl glycidyl ether.

11. The radiation-sensitive resin composition according to claim 1, wherein said component (B) forms a carboxylic acid by irradiation.

12. The radiation-sensitive resin composition according to claim 1, wherein said component (B) is selected from the group consisting of 1,2-benzoquinonediazidosulfonic acid esters, 1,2-naphthoquinonediazidosulfonic acid esters, 1,2-benzoquinonediazidosulfonic acid amides, 1,2-naphthoquinonediazidosulfonic acid amides and mixtures thereof.

13. The radiation-sensitive resin composition according to claim 1, further comprising a sensitizer for the component (B).

14. The radiation-sensitive resin composition according to claim 1, wherein said water-repellent siloxane is selected from the group consisting of linear siloxane resins, branched siloxane resins, cyclic siloxane resins, modified siloxane resins, polysiloxane copolymers and mixtures thereof.

15. The radiation-sensitive resin composition according to claim 1, wherein said water-repellent siloxane is selected from the group consisting of polyether-modified siloxane resins, alcohol-modified siloxane resins, copolymers of a polysiloxane and a polyalkylene oxide and mixtures thereof.

* * * * *